(12) United States Patent
Kosugi et al.

(10) Patent No.: US 11,282,919 B2
(45) Date of Patent: Mar. 22, 2022

(54) SEMICONDUCTOR DEVICE

(71) Applicants: NATIONAL INSTITUTE OF ADVANCED INDUSTRIAL SCIENCE AND TECHNOLOGY, Tokyo (JP); FUJI ELECTRIC CO., LTD., Kanagawa (JP); Mitsubishi Electric Corporation, Tokyo (JP)

(72) Inventors: Ryoji Kosugi, Ibaraki (JP); Kazuhiro Mochizuki, Tokyo (JP); Kohei Adachi, Tokyo (JP); Manabu Takei, Kanagawa (JP); Yoshiyuki Yonezawa, Ibaraki (JP)

(73) Assignees: NATIONAL INSTITUTE OF ADVANCED INDUSTRIAL SCIENCE AND TECHNOLOGY, Tokyo (JP); FUJI ELECTRIC CO., LTD., Kawasaki (JP); MITSUBISHI ELECTRIC CORPORATION, Tokyo (JP)

(*) Notice: Subject to any disclaimer, the term of this patent is extended or adjusted under 35 U.S.C. 154(b) by 33 days.

(21) Appl. No.: 16/970,388

(22) PCT Filed: Feb. 15, 2019

(86) PCT No.: PCT/JP2019/005575
§ 371 (c)(1),
(2) Date: Aug. 17, 2020

(87) PCT Pub. No.: WO2019/160086
PCT Pub. Date: Aug. 22, 2019

(65) Prior Publication Data
US 2021/0111245 A1    Apr. 15, 2021

(30) Foreign Application Priority Data
Feb. 19, 2018 (JP) .............................. JP2018-026847

(51) Int. Cl.
*H01L 29/06* (2006.01)
*H01L 21/78* (2006.01)
(Continued)

(52) U.S. Cl.
CPC .... *H01L 29/0634* (2013.01); *H01L 21/02378* (2013.01); *H01L 21/78* (2013.01);
(Continued)

(58) Field of Classification Search
CPC .......... H01L 29/0634; H01L 21/02378; H01L 21/78; H01L 29/0638; H01L 29/0661;
(Continued)

(56) References Cited

U.S. PATENT DOCUMENTS 7,034,376 B2 * 4/2006 Okada ................... H01L 29/861
                                                         257/471
8,384,182 B2 * 2/2013 Mazzola ............. H01L 29/8611
                                                         257/475

(Continued)

FOREIGN PATENT DOCUMENTS

JP    2010-028018 A    2/2010
JP    2010-045203 A    2/2010

(Continued)

OTHER PUBLICATIONS

International Search Report and Written Opinion dated Apr. 23, 2019 for PCT/JP2019/005575 filed on Feb. 15, 2019, 9 pages including English Translation of the International Search Report.

*Primary Examiner* — Cuong B Nguyen
(74) *Attorney, Agent, or Firm* — Xsensus LLP

(57) ABSTRACT

A semiconductor device that includes a SiC semiconductor substrate; a SiC epitaxial layer having an impurity concentration lower than that of the SiC semiconductor substrate; a first semiconductor layer including first semiconductor pillars and second semiconductor pillars; a second semicon-
(Continued)

ductor layer; a device active region; a termination region; a channel stopper region having an impurity concentration higher than that of the SiC epitaxial layer; and a plurality of first chip end portions and a plurality of second chip end portions, and a surface of the first side surface is covered with an impurity region having an impurity concentration higher than those of the first semiconductor pillar and the SiC epitaxial layer and is connected to the channel stopper region.

12 Claims, 27 Drawing Sheets

(51) Int. Cl.
*H01L 21/02* (2006.01)
*H01L 29/16* (2006.01)
*H01L 29/78* (2006.01)

(52) U.S. Cl.
CPC ...... *H01L 29/0638* (2013.01); *H01L 29/0661* (2013.01); *H01L 29/1608* (2013.01); *H01L 29/7811* (2013.01)

(58) Field of Classification Search
CPC ............. H01L 29/1608; H01L 29/7811; H01L 21/3065; H01L 29/7395; H01L 29/7802; H01L 29/0619–0623; H01L 29/7823
See application file for complete search history.

(56) References Cited

U.S. PATENT DOCUMENTS

| | | |
|---|---|---|
| 2009/0079002 A1 | 3/2009 | Lee et al. |
| 2012/0273871 A1 | 11/2012 | Yedinak et al. |
| 2012/0273875 A1 | 11/2012 | Yedinak et al. |
| 2012/0273884 A1 | 11/2012 | Yedinak et al. |
| 2012/0273916 A1 | 11/2012 | Yedinak et al. |
| 2012/0276701 A1 | 11/2012 | Yedinak et al. |
| 2015/0069567 A1 | 3/2015 | Yedinak et al. |
| 2015/0187873 A1 | 7/2015 | Yedinak et al. |
| 2016/0035881 A1 | 2/2016 | Tamura et al. |
| 2017/0294521 A1 | 10/2017 | Tamura et al. |
| 2019/0157399 A1 | 5/2019 | Kosugi et al. |

FOREIGN PATENT DOCUMENTS

| | | |
|---|---|---|
| JP | 2012-019088 A | 1/2012 |
| JP | 6164672 B1 | 7/2017 |
| JP | 2018-019053 A | 2/2018 |
| WO | 2009/039441 A1 | 3/2009 |
| WO | 2015/040938 A1 | 3/2015 |

\* cited by examiner

SEMICONDUCTOR DEVICE

CROSS-REFERENCE TO RELATED APPLICATIONS

The present application is based on PCT filing PCT/JP2019/005575, filed Feb. 15, 2019, which claims priority to JP 2018-026847, filed Feb. 19, 2018, the entire contents of which are incorporated herein by reference.

TECHNICAL FIELD

The present invention relates to a semiconductor device and can be suitably used for, for example, a semiconductor device having a super junction structure.

BACKGROUND ART

For the purpose of significantly reducing the loss in a vertical power device in which a high withstand voltage is required and a large current flows, a semiconductor device that uses silicon carbide (SiC), which is a new semiconductor material replacing conventional silicon (Si), as a semiconductor has been studied. Since a dielectric breakdown field strength of SiC is about 10 times greater than that of Si, SiC is a semiconductor material that can make the drift layer that maintains the withstand voltage thin and have a high concentration, and can reduce the conduction loss.

Further, in a vertical power device, adoption of a super junction structure has been studied in order to reduce the on-resistance while maintaining the withstand voltage.

For example, Patent Document 1 discloses a semiconductor device using a substrate made of silicon carbide (SiC) single crystal. This semiconductor device has a super junction structure composed of p-type column regions each made of a semiconductor layer buried in a trench and n-type column regions each made of a portion of the substrate between adjacent trenches.

Further, Patent Document 2 discloses a power device including an active region, a termination region surrounding the active region, and a plurality of pillars of first and second conductivity types which are alternately arranged in each of the active region and the termination region. It also discloses that a mesa gap is arranged in a peripheral region of a termination trench (FIGS. 31 and 32).

In addition, Patent Document 3 discloses a semiconductor wafer and a semiconductor device in which, even in a case of having a stripe-shaped pattern in which a cutting surface of a super junction structure (abbreviated as SJ structure) is exposed at the time of cutting into semiconductor chips, occurrence of leakage current due to the SJ structure exposed on the cutting surface is suppressed. More specifically, in the case of the SJ structure having the stripe-shaped pattern, a V-shaped groove 17 is formed by wet etching in a cutting region 18 for cutting semiconductor chips out of a wafer, and a high-concentration n-type surface layer 19 is formed on a surface of a side wall on which the cutting surface is exposed (FIGS. 4, 8, and 9). It further describes that the etching groove formed in the cutting region 18 may be a U-shaped groove having a side wall perpendicular to the substrate surface formed by anisotropic dry etching by RIE.

In addition, Patent Document 4 discloses a semiconductor chip having a super junction structure with no void and high productivity and a manufacturing method thereof. More specifically, it describes a process of forming a super junction structure extending in one direction over the entire wafer surface by trench filling and cutting the wafer into a plurality of chips along dicing lines DL (FIG. 4). At this time, on a dicing surface DS on which cross-sections of an n-type silicon layer 12 and a p-type silicon pillar 14 at a termination portion of a semiconductor chip 1 are exposed, an $n^+$-type diffusion region 20 having an impurity concentration higher than that of the n type silicon layer 12 is formed so as to partially cover upper portions of the n-type silicon layer 12 and the p-type silicon pillar 14 (FIGS. 1 and 3).

Also, Patent Document 5 discloses a semiconductor device capable of suppressing a decrease in withstand voltage and an increase in leakage current due to a crystal defect of an impurity layer at an end of a trench to be filled in a super junction structure. More specifically, since the crystal defect is caused (FIG. 3) at the end portions of trenches J4 (the region surrounded by one-dot chain line in FIG. 7) when filling the inside of the stripe-shaped trenches J4 formed in an n-type drift layer J1 with a p-type region 3, the process (FIG. 4) of removing the defect by forming defect removal trenches 13 at the end portions of the trenches is described. The side wall surface of each defect removal trench 13 is made to be an n-type region 14 by ion implantation, and the inside of each trench 13 is filled with an insulating member 15 (FIGS. 1, 2 and 5).

RELATED ART DOCUMENTS

Patent Documents

Patent Document 1: Japanese Patent No. 6164672
Patent Document 2: Japanese Patent Application Laid-Open Publication No. 2010-541212 (WO2009/039441)
Patent Document 3: Japanese Patent Application Laid-Open Publication No. 2010-28018
Patent Document 4: Japanese Patent Application Laid-Open Publication No. 2010-45203
Patent Document 5: Japanese Patent Application Laid-Open Publication No. 2012-19088

SUMMARY OF THE INVENTION

Problems to be Solved by the Invention

The inventors of the present invention have engaged in research and development of a vertical power MOSFET in which a super junction structure is adopted and a SiC substrate is used, and have been earnestly studying the improvement of its performance.

Then, it has been found that, in the event of applying the super junction structure to the SiC substrate, as will be described later in detail, voids are generated when trenches constituting columns are filled, and these voids cause characteristic deterioration (leakage current) of the semiconductor device.

Therefore, it is desired to study the structure and manufacturing process of the semiconductor device capable of avoiding the influence of the voids mentioned above.

The other problems and novel features will be apparent from the description of the specification and the accompanying drawings.

Means for Solving the Problems

The following is a brief description of the outline of a typical embodiment among the embodiments disclosed in this application.

A semiconductor device described in an embodiment disclosed in this application includes: a SiC semiconductor substrate of a first conductivity type; a SiC epitaxial layer of the first conductivity type provided on the SiC semiconductor substrate and having an impurity concentration lower than that of the SiC semiconductor substrate; a first semiconductor layer provided as a part of the SiC epitaxial layer and including first semiconductor pillars of the first conductivity type and second semiconductor pillars of a second conductivity type which extend in a first direction and are arranged alternately and repeatedly in a main surface of the SiC semiconductor substrate; a second semiconductor layer of the first conductivity type, which is a layer other than the first semiconductor layer in the SiC epitaxial layer and located between the semiconductor substrate and the first semiconductor layer; a device active region provided on a main surface of the first semiconductor layer; a termination region provided on the main surface of the first semiconductor layer and surrounding the device active region; a channel stopper region of the first conductivity type provided on the main surface of the first semiconductor layer, surrounding the termination region, and having an impurity concentration higher than that of the SiC epitaxial layer; and a plurality of first chip end portions parallel to a second direction intersecting with the first direction and a plurality of second chip end portions parallel to the first direction, the first chip end portions and the second chip end portions being provided so as to define a quadrilateral semiconductor chip, wherein the first chip end portion includes a first side surface having a height of a cross-section from the first semiconductor layer to a middle of the second semiconductor layer and a second side surface having a height from the middle of the second semiconductor layer to a back surface of the semiconductor substrate, and in the first chip end portion, a surface of the first side surface is covered with an impurity region of the first conductivity type having an impurity concentration higher than those of the first semiconductor pillar and the SiC epitaxial layer and is connected to the channel stopper region.

Effects of the Invention

According to the semiconductor device described in the typical embodiment disclosed in this application, it is possible to improve the characteristics of the semiconductor device.

BRIEF DESCRIPTIONS OF THE DRAWINGS

DETAILED DESCRIPTION OF PREFERRED EMBODIMENTS

Figure 1:
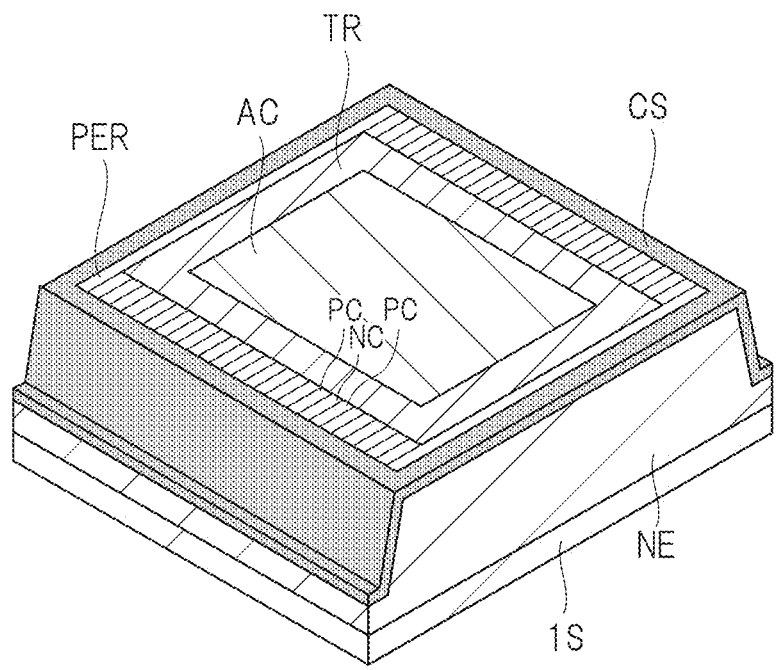
FIG. 1 is a perspective view schematically showing a configuration of a semiconductor device according to the first embodiment.

Hereinafter, embodiments of the present invention will be described in detail with reference to the drawings. Note that components having the same function are denoted by the same reference characters throughout the drawings for describing the embodiments, and the repetitive description thereof will be omitted.

In addition, in the drawings used for the description of the embodiments, hatching may be omitted in some cases even in cross-sectional views in order to make the drawings easy to see. Further, hatching may be applied in some cases even in plan views in order to make the drawings easy to see.

Also, in the cross-sectional views and the plan views, the size of respective components does not correspond to that of an actual device, and a specific component may be illustrated relatively largely in some cases in order to make the drawings easily understood.

First Embodiment

[Description of Structure]

Figure 2:
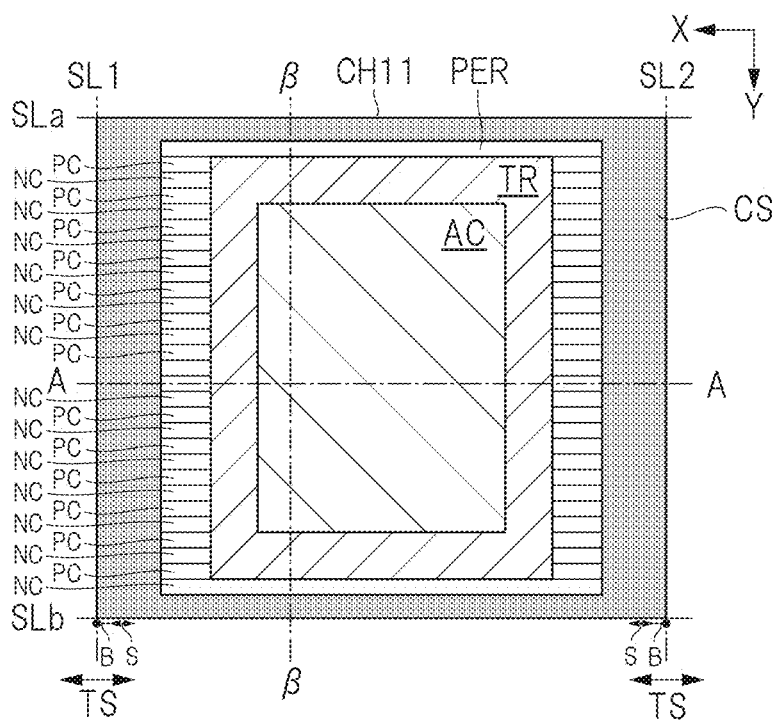
FIG. 2 is a top view schematically showing the configuration of the semiconductor device according to the first embodiment.
Figure 3:
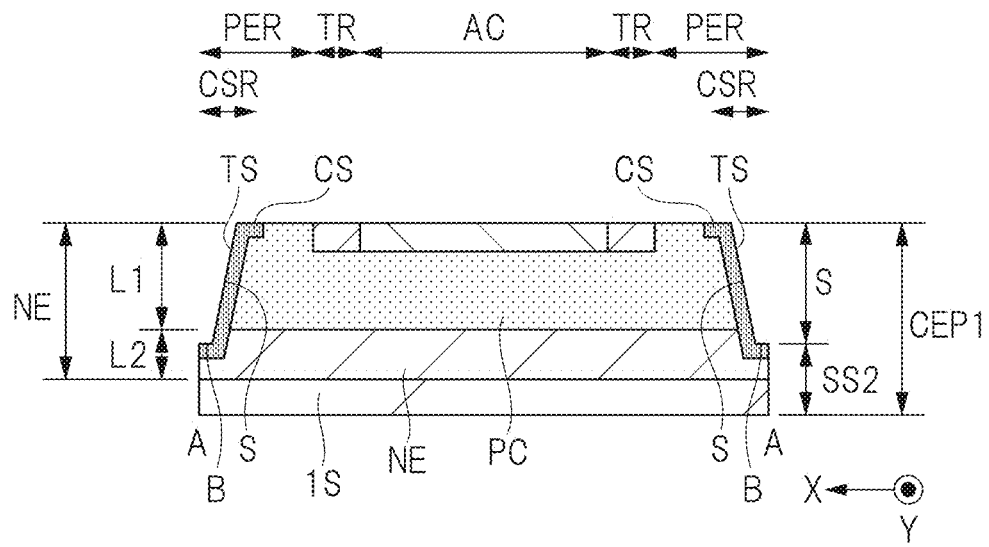
FIG. 3 is a cross-sectional view schematically showing the configuration of the semiconductor device according to the first embodiment.
Figure 4:
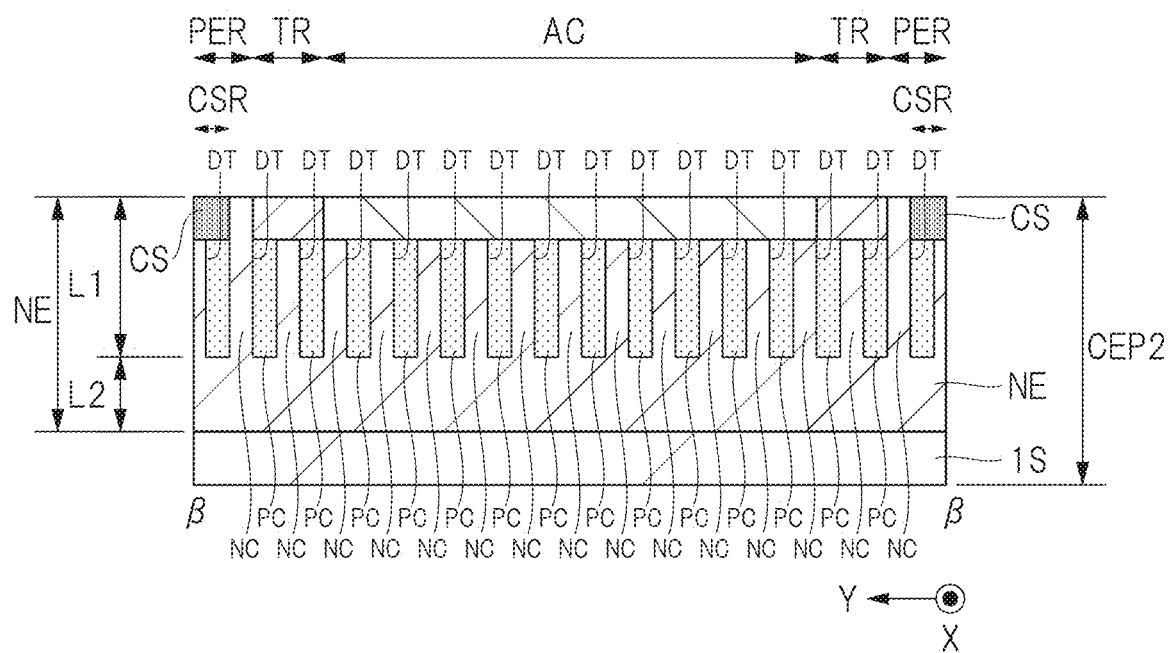
FIG. 4 is a cross-sectional view schematically showing the configuration of the semiconductor device according to the first embodiment.

FIG. 1 is a perspective view schematically showing a configuration of a semiconductor device according to this embodiment. FIG. 2 is a top view schematically showing the configuration of the semiconductor device according to this embodiment. FIG. 3 and FIG. 4 are cross-sectional views schematically showing the configuration of the semiconductor device according to this embodiment. FIG. 3 corresponds to, for example, the A-A cross-section of FIG. 2, and FIG. 4 corresponds to, for example, the β-β cross-section of FIG. 2.

The semiconductor device according to this embodiment is a vertical power device using a SiC substrate, and has, for example, a vertical MOSFET (Metal Oxide Semiconductor Field Effect Transistor) as described later (see FIG. 28). Note that, in FIG. 1, FIG. 3, FIG. 4, and the like, detailed components (including a source electrode and a drain electrode) of the vertical power device are omitted from illustration.

As shown in FIGS. 1 and 2, the semiconductor device (semiconductor chip) according to this embodiment has a rectangular shape in a plan view when seen from the top. Also, the semiconductor device according to this embodiment has an active region AC, a termination region TR, and a peripheral region PER. The active region (device active region) AC is disposed in the center of the substantially rectangular semiconductor device, the termination region TR is disposed so as to surround the outside of the active region AC, and the peripheral region PER is disposed so as to surround the termination region TR. Further, a channel stopper region CS is provided at the end of the peripheral region PER. In other words, the channel stopper region CS with a rectangular ring shape is provided in the peripheral region PER along the end portion thereof. The channel stopper region CS with a rectangular ring shape has an inner wall and an outer wall. The outer wall is located at the end portion of the semiconductor chip. The formation region of the channel stopper region CS is denoted by "CSR".

As shown in FIGS. 1 to 4, in the active region AC, the termination region TR, and the peripheral region PER (excluding the channel stopper formation region CSR), a structure in which linear p-type column regions (p-type pillars, semiconductor pillars) PC and linear n-type column regions (n-type pillars, semiconductor pillars) NC are alternately and repeatedly arranged is formed. Namely, the linear p-type column regions PC and the linear n-type column regions NC extend to the inner wall (inner end) of the channel stopper region CS.

The structure in which the p-type column regions PC and the n-type column regions NC are alternately and repeatedly arranged is referred to as a super junction structure. The super junction structure is also referred to as a SJ structure in some cases. A power device (vertical MOSFET) is formed in the active region AC of the structure in which the p-type column regions PC and the n-type column regions NC are alternately and repeatedly arranged (see FIG. 28). With such a super junction structure, the depletion layer extends in the lateral direction from the pn junction extending in the longitudinal direction, so that the withstand voltage can be ensured. The SJ structure shown in FIG. 3 and FIG. 4 is formed as a part of an epitaxial layer NE, and the epitaxial layer NE can be defined as being made up of a first semiconductor layer L1 in which the SJ structure is formed and a second semiconductor layer L2 as a rest except the first semiconductor layer L1. The structure in which the n-type and p-type pillars are formed at an intermediate depth of the epitaxial layer NE in this manner can also be referred to as a semi-super junction structure. In such a semi-SJ structure in which the p column depth is shallower than the drift layer thickness, the full depletion of the drift layer is less likely to occur during reverse recovery of the body diode, and the reverse recovery current tends to have a soft recovery waveform with a tail. Therefore, it is possible to obtain the effect of suppressing the voltage surge due to the parasitic inductance of the circuit and suppressing the element breakdown and ringing due to the overvoltage.

Here, in this embodiment, the channel stopper formation region CSR is provided at the end of the semiconductor device (semiconductor chip), and the p-type column regions PC and the n-type column regions NC extending to the inner wall of the channel stopper region CS are covered with the channel stopper region CS. In other words, the exposed cross-sections of the side surfaces of the p-type column regions PC and the n-type column regions NC are covered with the channel stopper region CS. The channel stopper region CS is defined as an n-type region, and the impurity concentration (doping concentration) thereof is at least 10 times higher than the impurity concentration of the n-type column region NC.

A semiconductor chip (semiconductor device) CH11 according to this embodiment is an individual piece cut out from a semiconductor wafer W described later with reference to FIGS. 5 and 8, and has four chip end portions provided so as to define a quadrilateral chip. Two first chip end portions CEP1 parallel to the Y direction (also referred to as the second direction) as shown in FIGS. 2 and 3 are formed by two scribe lines SL1 and SL2 in the Y direction. As shown in FIG. 3, the first chip end portion CEP1 is roughly divided into a side surface (or a first side surface) S including exposed cross-sections of the p-type column regions PC and the n-type column regions NC and a second side surface SS2 including exposed cross-sections of the substrate 1S and the epitaxial layer NE. In this embodiment, as will be described later, it is preferable to selectively cover only the side surface S with the channel stopper region CS for convenience of device fabrication, but in principle, the entire first chip end portion CEP1 may be covered with the channel stopper region CS. Note that the first chip end portion CEP1 in FIG. 3 has a structure of a bottom surface B forming a stepped portion in addition to the side surface S and the second side surface SS2. The structure of the bottom surface B is optional and can be omitted as shown in the later application example.

On the other hand, two second chip end portions CEP2 parallel to the X direction (also referred to as the first direction) as shown in FIGS. 2 and 4 are formed by two scribe lines SLa and SLb in the X direction. In the second chip end portion CEP2, there are exposed cross-sections of the substrate 1S, the epitaxial layer NE, and the n-type region of the n-type column region NC. It is also possible to cover the second chip end portion CEP2 with the channel stopper region CS, but this is not essential for reducing the leakage current. Further, the second chip end portion CEP2 does not have to be right above the n-type column region NC and may be cut along a region that cuts the p-type column region PC in parallel. Namely, the leakage current caused by the second chip end portion CEP2 is not significant.

In this embodiment, the leakage current can be reduced by covering the exposed cross-sections of the p-type column regions PC and the n-type column regions NC with the channel stopper region CS. More specifically, it becomes possible to separate the voids generated at the end portions of the p-type column regions PC described later by covering the side surfaces of the super junction structure with the channel stopper region CS, so that it is possible to achieve the improvement of the characteristics of the semiconductor device such as the reduction of the leakage current.

Figure 5:
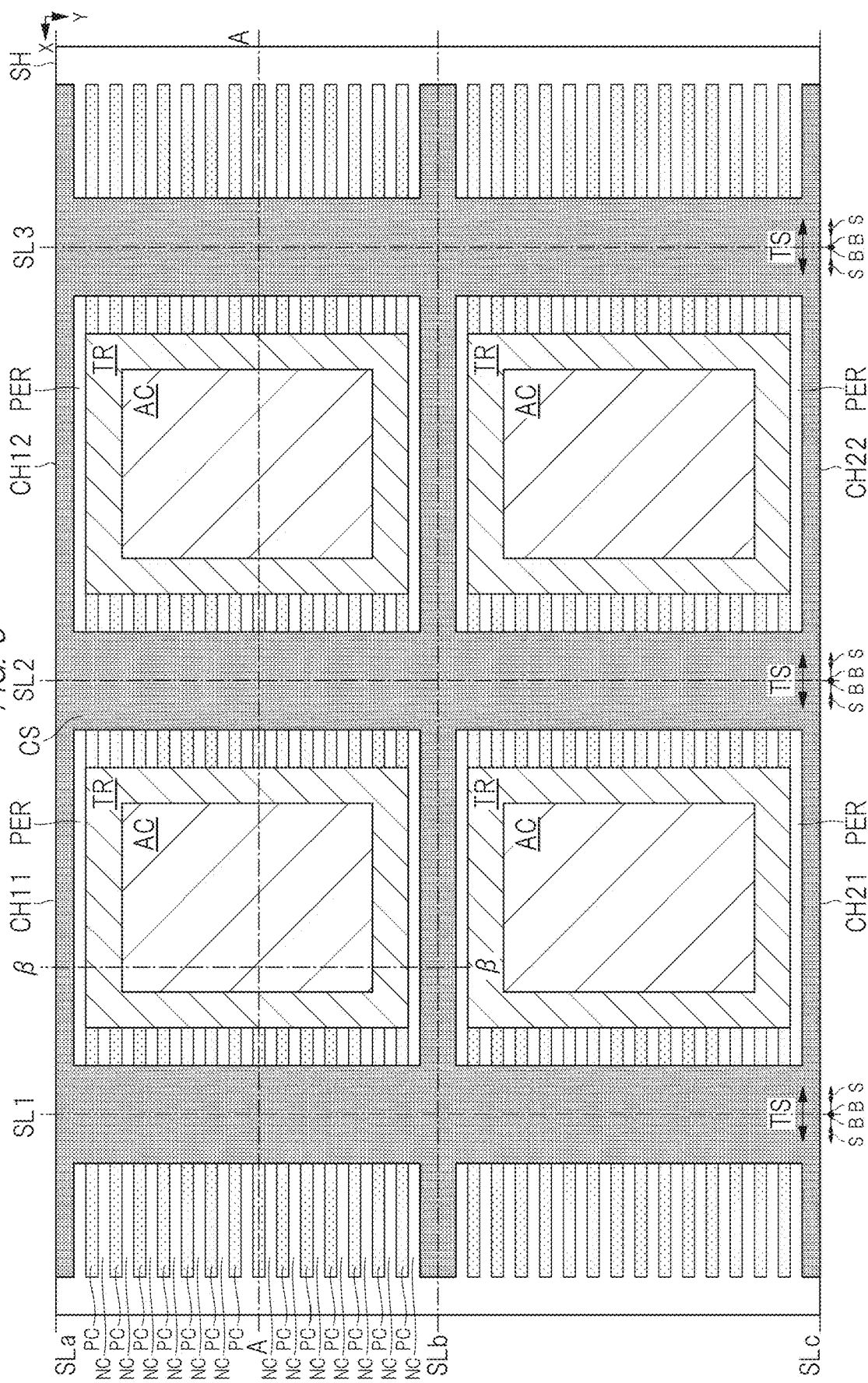
FIG. 5 is a plan view schematically showing a configuration of an exposure unit region of the semiconductor device according to the first embodiment.
Figure 6:
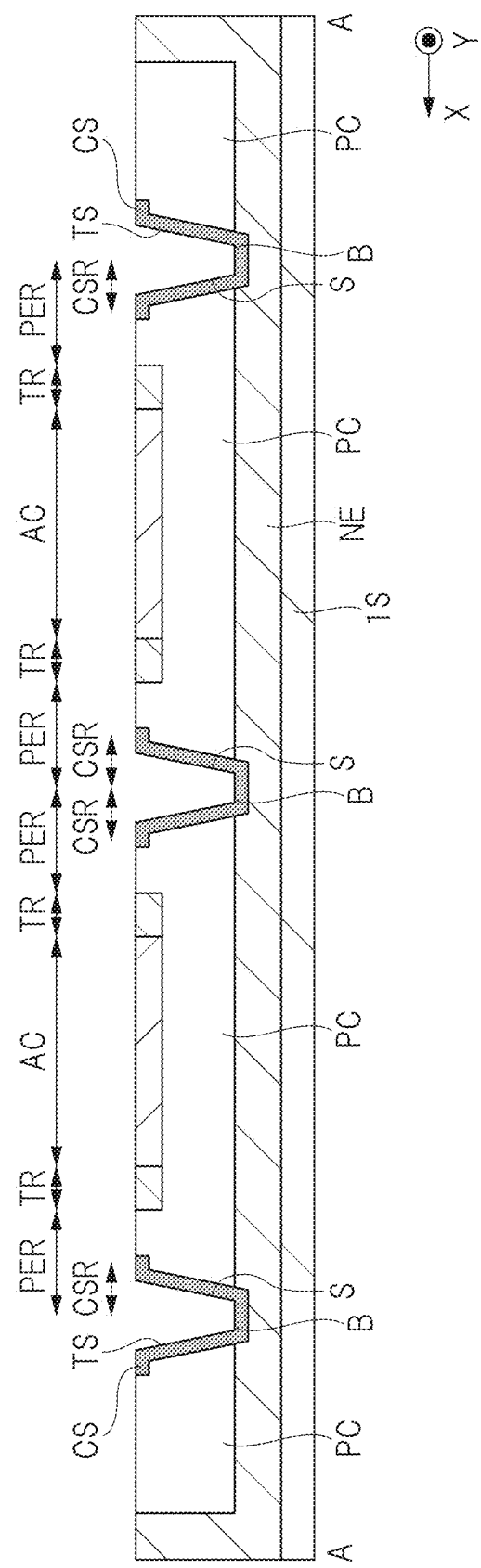
FIG. 6 is a cross-sectional view schematically showing the configuration of the exposure unit region of the semiconductor device according to the first embodiment.
Figure 7:
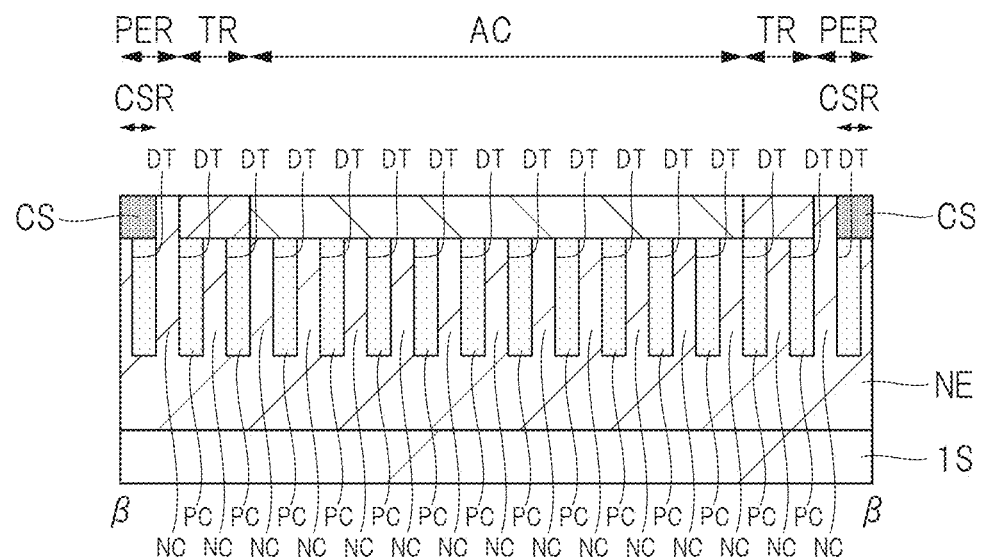
FIG. 7 is a cross-sectional view schematically showing the configuration of the exposure unit region of the semiconductor device according to the first embodiment.

FIG. 5 is a plan view schematically showing a configuration of an exposure unit region of the semiconductor device according to this embodiment, and FIG. 6 and FIG. 7 are cross-sectional views schematically showing the configuration of the exposure unit region of the semiconductor device according to this embodiment. For example, FIG. 6 corresponds to the A-A cross-section of FIG. 5, and FIG. 7 corresponds to, for example, the β-β cross-section of FIG. 5. The plan view of FIG. 5 shows a formation region of four semiconductor chips (CH11, CH12, CH21, CH22), and this region SH corresponds to, for example, a one-shot exposure region (exposure unit region) in a manufacturing process of the semiconductor device.

Figure 8:
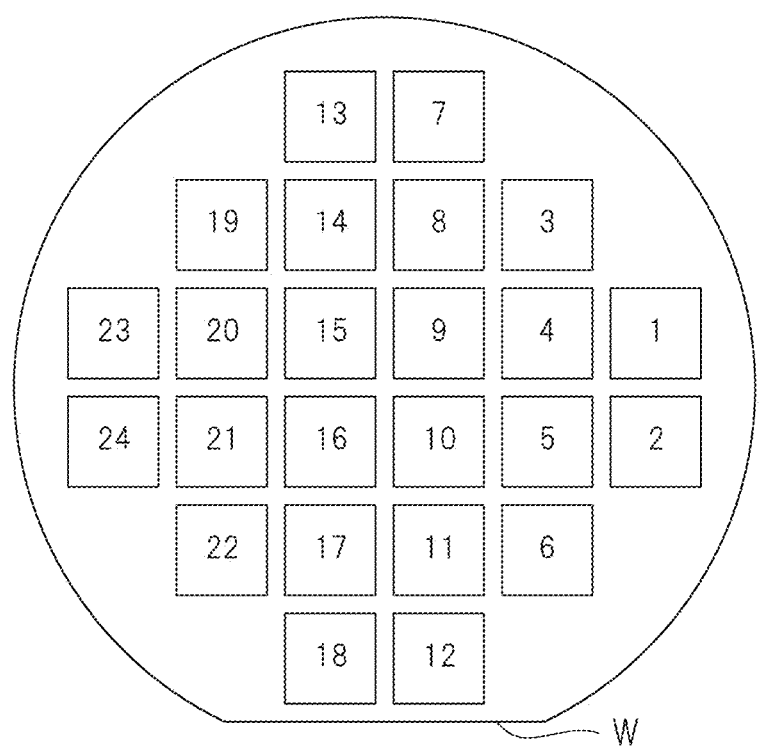
FIG. 8 is a plan view showing a semiconductor wafer.

FIG. 8 is a plan view showing the semiconductor wafer W. The above-mentioned region (one-shot exposure region) SH corresponds to, for example, each of the rectangular regions denoted by 1 to 24 in FIG. 8.

As shown in FIGS. 5 to 7, in the above-mentioned region (one-shot exposure region) SH, the two semiconductor devices (semiconductor chips) according to this embodiment described with reference to FIGS. 1 to 4 are arranged in the X direction and the Y direction (2×2), and the four semiconductor devices (semiconductor chips) are formed in total. The semiconductor devices (semiconductor chips) can be cut out by cutting the semiconductor wafer (W) on which the plurality of semiconductor devices (semiconductor chips) are formed in the X direction and the Y direction. The cutting lines along the X direction or the Y direction are referred to as "scribe lines (SL1 to SL3, SLa to SLc)".

[Studied Matters]

Next, the matters studied for finding the semiconductor device having the above-mentioned configuration will be described below.

Figure 9:
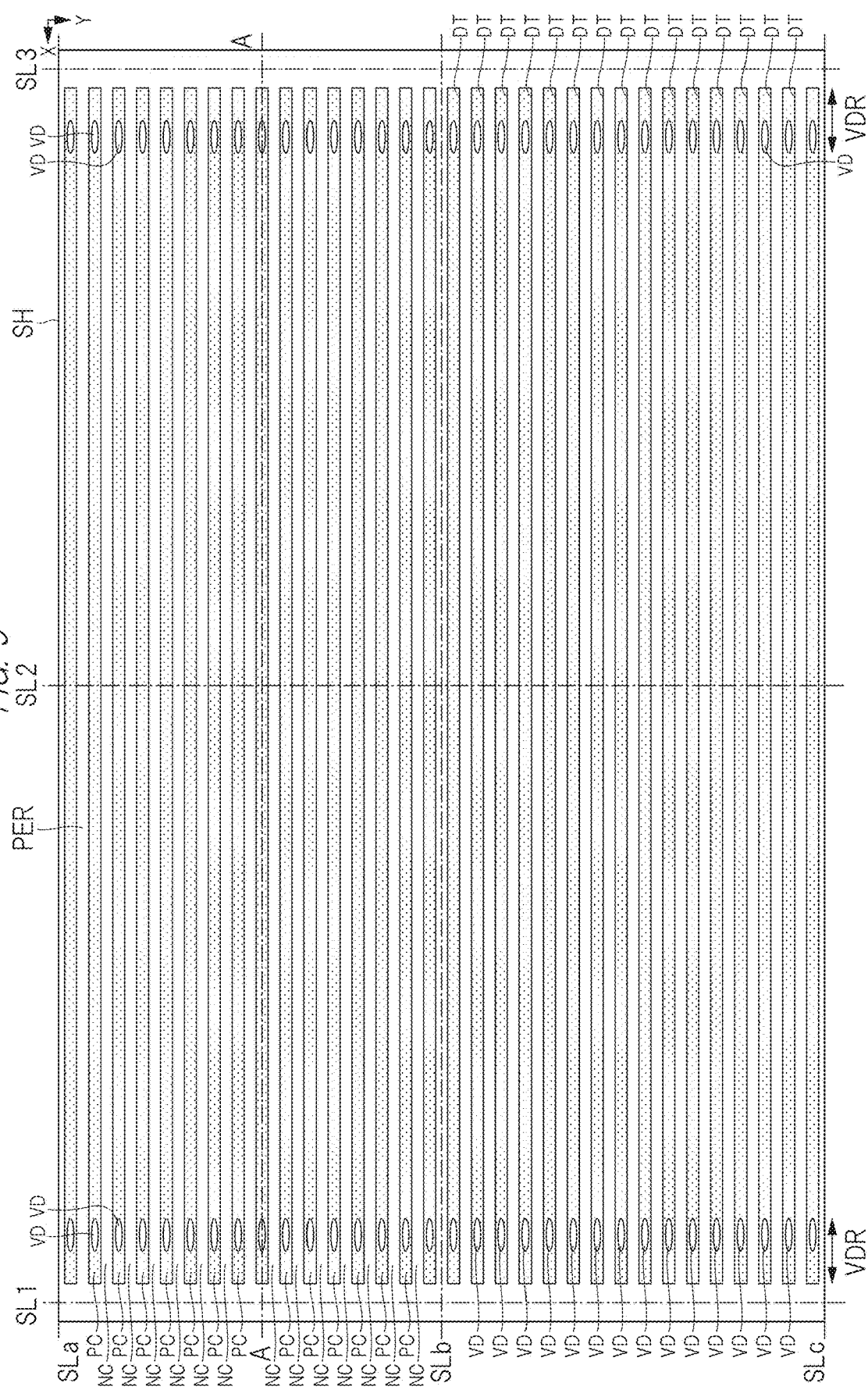
FIG. 9 is a plan view showing voids in p-type column regions.
Figure 10:
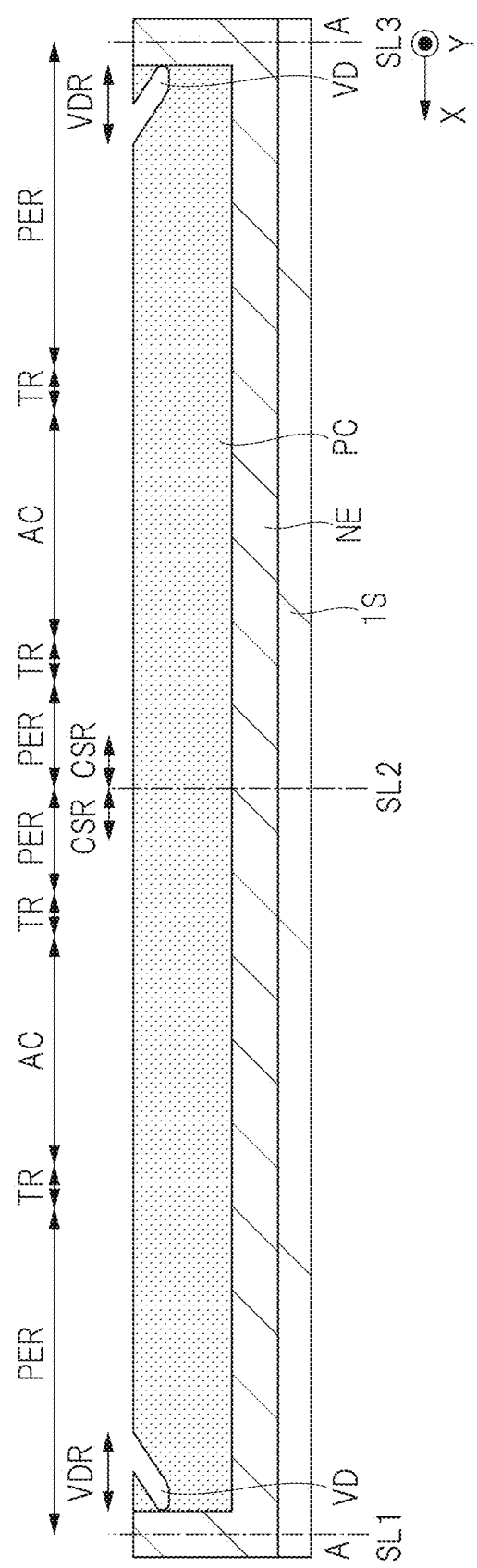
FIG. 10 is a cross-sectional view showing the voids in the p-type column region.
Figure 11:
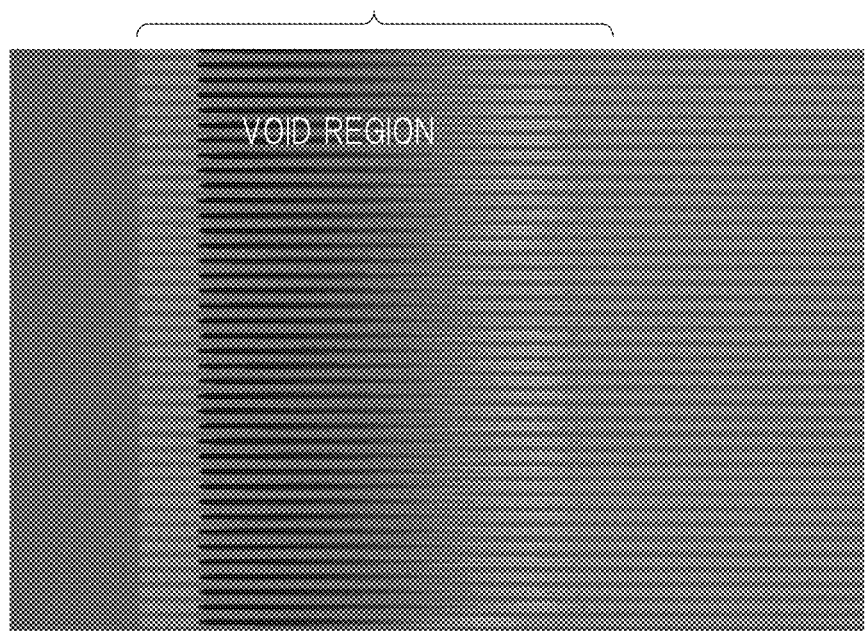
FIG. 11 is a photograph showing the voids generated at end portions of deep trenches.

The p-type column regions PC constituting the above-mentioned super junction structure are formed by filling the deep trenches (grooves) DT provided in the SiC substrate with p-type semiconductor regions by using the epitaxial growth method (so-called trench fill method). It has been found that, when filling the deep trenches DT with the p-type semiconductor regions, the defective filling occurs and voids VD are formed at the end portions of the deep trenches DT extending in the X direction in a plan view. FIG. 9 and FIG. 10 are a plan view and a cross-sectional view showing the voids of the p-type column regions. FIG. 11 is a photograph showing the voids generated at the end portions of the deep trenches. In FIG. 9, FIG. 10, and the like, the formation region of the void VD is denoted by "VDR".

In FIG. 11, voids shown in black can be confirmed near the end portions of the p-type column regions shown in gray. The voids VD shown in FIGS. 9 to 11 are considered to be generated due to the difference in the epitaxial growth properties depending on the location of the deep trenches DT. Namely, in the central portion of each deep trench DT extending in the X direction in a plan view, the p-type semiconductor region is epitaxially grown from the opposing side surfaces and the bottom surface. On the other hand, at the end portion of each deep trench DT extending in the X direction in a plan view, the p-type semiconductor region is epitaxially grown not only from the opposing side surfaces and the bottom surface but also from the side surface extending in the Y direction. Therefore, it is conceivable that the epitaxial growth rate becomes non-uniform and the void VD is generated. In particular, in the epitaxial growth of SiC performed in an atmosphere close to atmospheric pressure, the voids VD described above are likely to be generated unlike the epitaxial growth of Si performed in a reduced pressure atmosphere.

When the semiconductor device (semiconductor chip) including such voids VD is cut out (see FIG. 10), that is, when the scribe lines (SL1, SL3) are provided outside the end portions of the deep trenches DT extending in the X direction and the semiconductor device (semiconductor chip) is cut out along these lines, the voids VD are taken into the semiconductor device (semiconductor chip). In this case, a leakage current is generated along the voids VD, and the performance of the semiconductor device is deteriorated.

Figure 12:
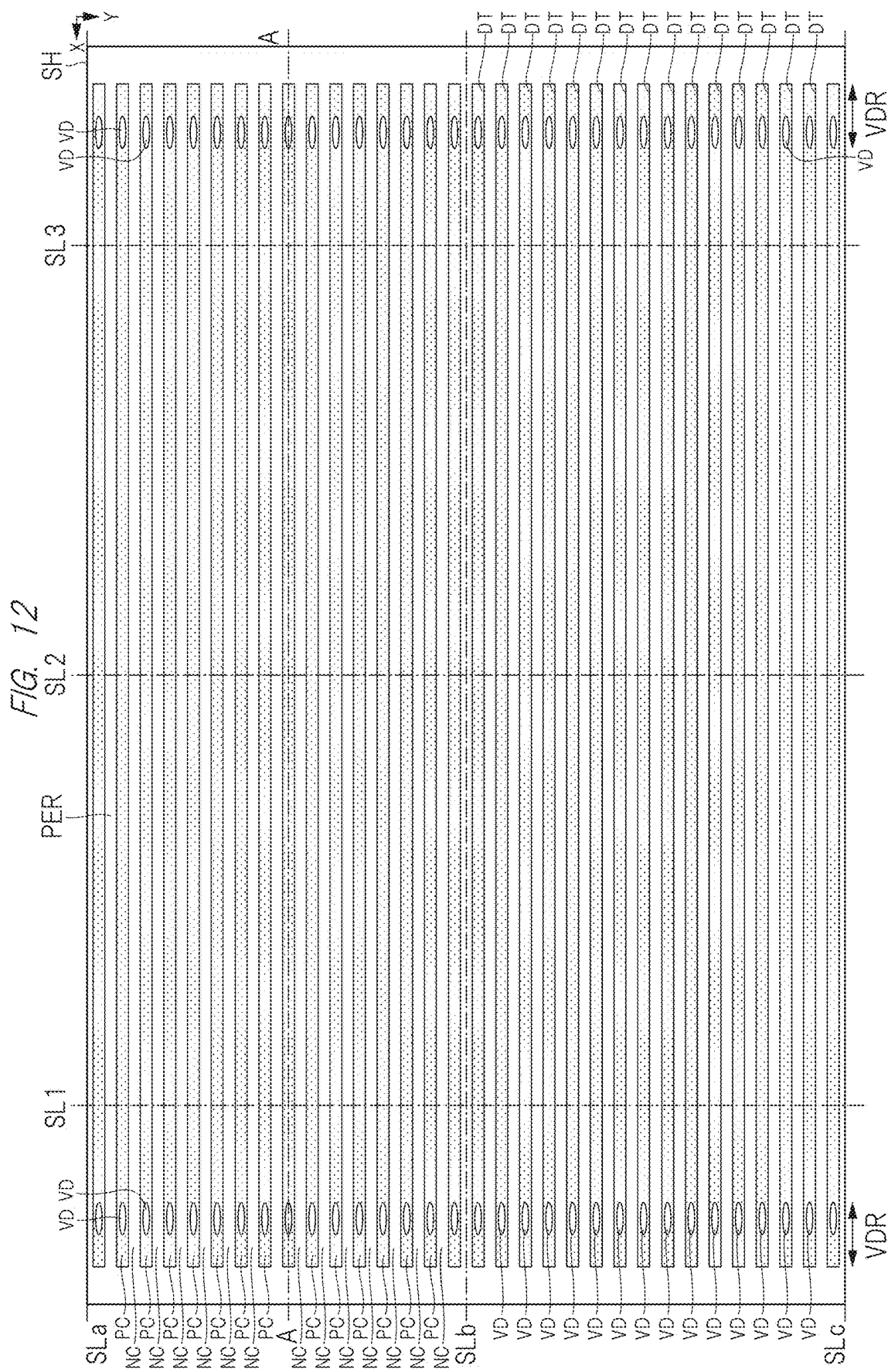
FIG. 12 is a plan view showing a positional relationship between the voids in the p-type column regions and scribe lines.
Figure 13:
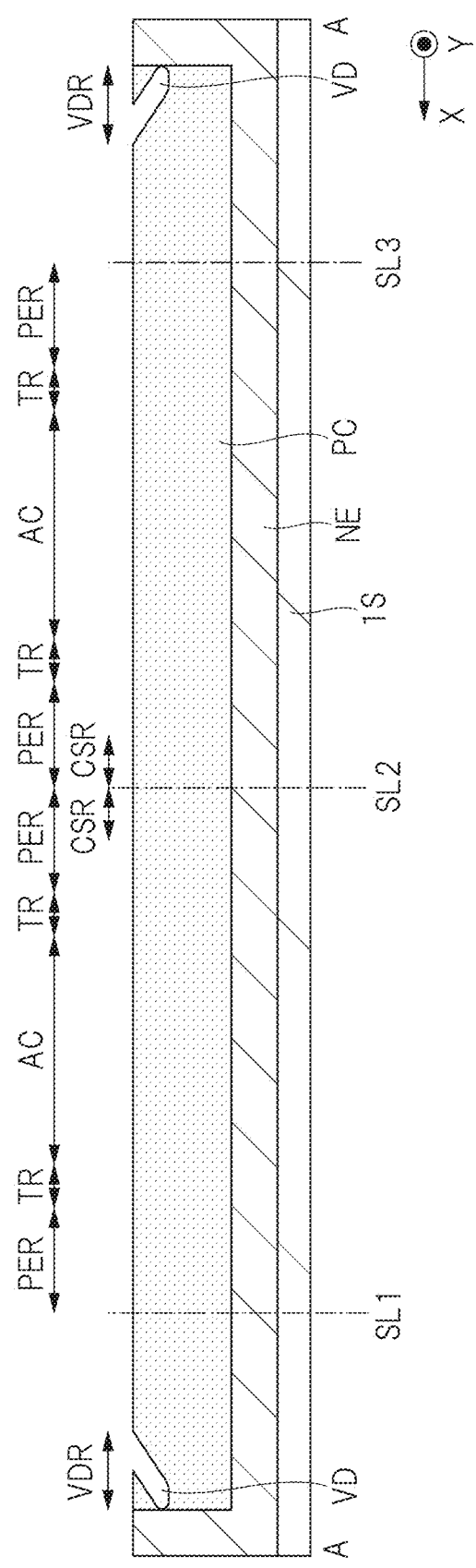
FIG. 13 is a cross-sectional view showing the positional relationship between the voids in the p-type column region and the scribe lines.

In order to avoid the influence of the voids VD described above, it is conceivable to provide the scribe lines (SL1, SL3) inside the voids VD and cut out the semiconductor device (semiconductor chip) along these scribe lines as shown in FIGS. 12 and 13. FIG. 12 and FIG. 13 are a plan view and a cross-sectional view showing the positional relationship between the voids in the p-type column regions and the scribe lines (SL1, SL3).

Figure 14:
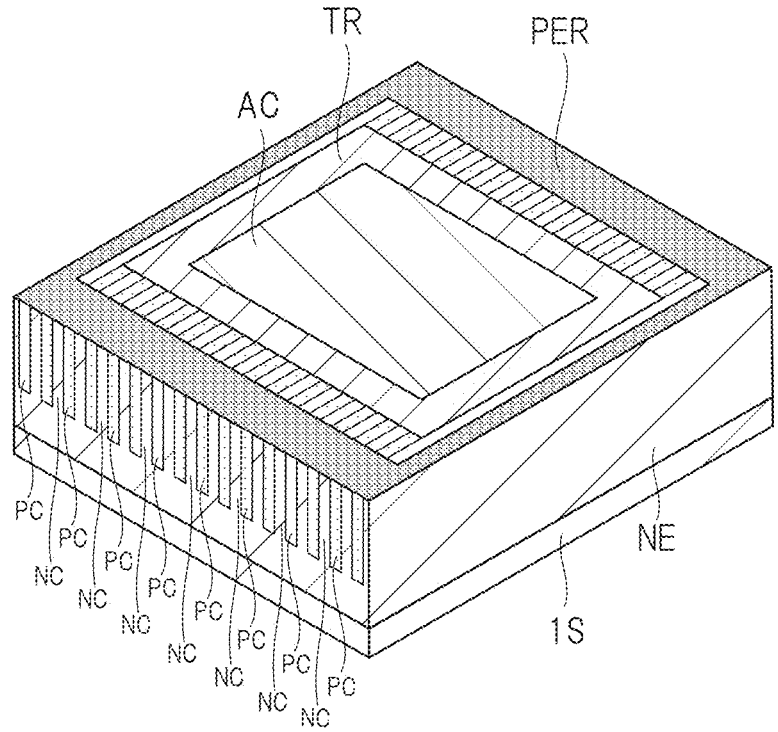
FIG. 14 is a perspective view of a semiconductor device cut out along the scribe lines inside the voids.

In this case, however, the p-type column regions PC and the n-type column regions NC are exposed at the end portions of the semiconductor chip as shown in FIG. 14. FIG. 14 is a perspective view of the semiconductor device (semiconductor chip) cutout along the scribe lines inside the voids. When the p-type column regions PC and the n-type column regions NC are exposed in this way, the depletion layer extending in the lateral direction from the pn junction, that is, the depletion layer to which a high electric field is applied is exposed. In such a configuration, the leakage current is generated at the end portion of the semiconductor chip, resulting in inconvenience in device operation.

Therefore, in the semiconductor device according to this embodiment, the end portions of the p-type column regions PC and the n-type column regions NC (exposed surfaces of the p-type column regions PC and the n-type column regions NC in FIG. 14) are covered with the channel stopper region CS as described above, thereby avoiding the inconvenience above.

Further, the ion implantation deeper than the depths of the p-type column regions PC and the n-type column regions NC at the end portion of the semiconductor chip is difficult in the SiC layer. Therefore, as described above, after forming the scribe trenches in the scribe region and providing tapered portions (S) at the end portions (side walls) of the semiconductor chip, the channel stopper region CS is formed by ion implantation, thereby covering the p-type column regions PC and the n-type column regions NC with the channel stopper region CS.

As described above, in the semiconductor device according to this embodiment, the influence of the voids VD can be avoided, and the inconvenience due to the exposure of the p-type column regions PC and the n-type column regions NC can be avoided.

[Description of Manufacturing Method]

Figure 15:
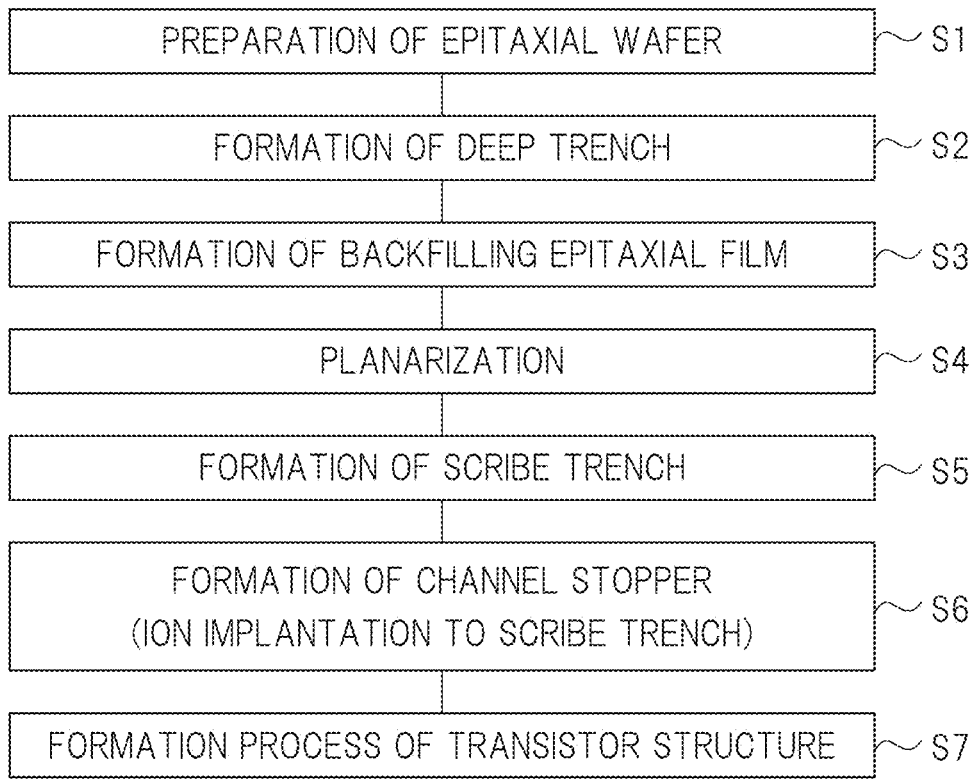
FIG. 15 is a diagram (flow diagram) showing a manufacturing process of the semiconductor device according to the first embodiment.
Figure 16:
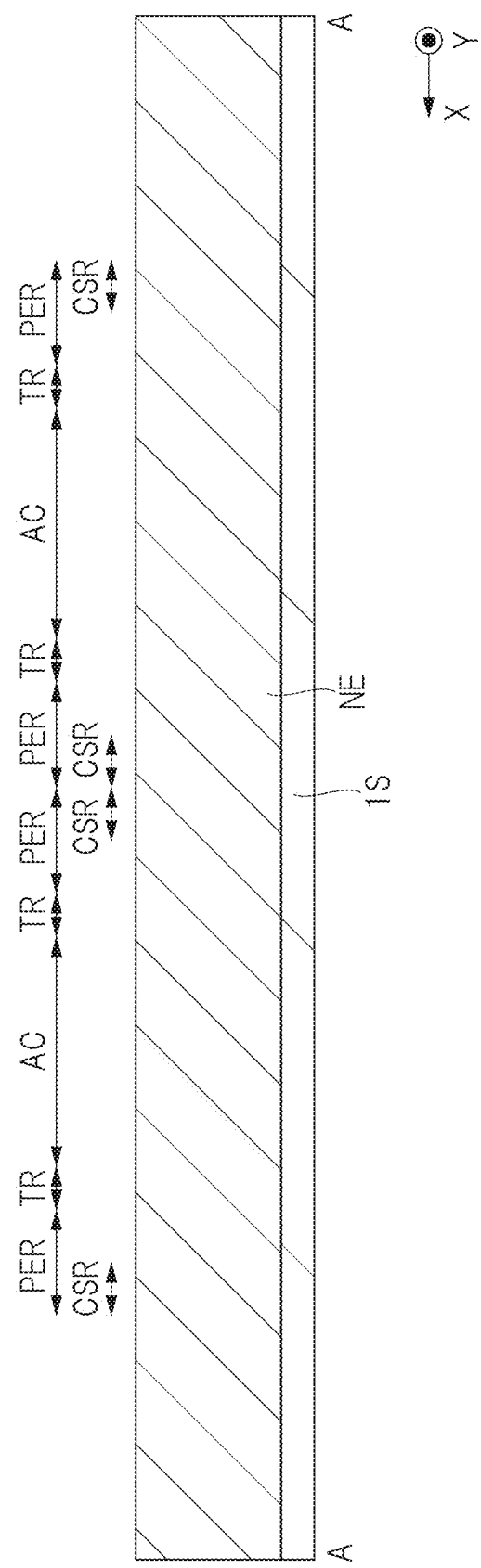
FIG. 16 is a cross-sectional view showing the manufacturing process of the semiconductor device according to the first embodiment.

Next, a manufacturing method of the semiconductor device according to this embodiment will be described with reference to FIGS. 15 to 27, and the configuration of the semiconductor device according to this embodiment will be clarified. FIG. 15 is a diagram (flow diagram) showing a manufacturing process of the semiconductor device according to this embodiment. FIGS. 16 to 29 are cross-sectional views and plan views showing the manufacturing process of the semiconductor device according to this embodiment.

First, as shown in step S1 of FIG. 15, an epitaxial wafer is prepared. The epitaxial wafer is a SiC substrate 1S shown in FIG. 16 in which an epitaxial layer NE made of an n-type semiconductor layer is formed on a main surface (front surface, upper surface). The SiC substrate 1S is made of SiC into which an n-type impurity such as phosphorus (P) or nitrogen (N) is introduced. A substrate having an off angle may be used as the SiC substrate 1S. As to the off angle, for example, a SiC substrate having a main surface in which the (0001) plane is tilted by 4° in the <11-20> direction can be used. Further, as to the SiC substrate 1S, a 4H polytype substrate (4H—SiC) or a 6H polytype substrate (6H—SiC) can be used as a hexagonal crystal substrate.

Also, the epitaxial layer NE is made of a SiC layer and is formed by epitaxially growing a SiC layer while introducing an n-type impurity such as phosphorus (P) or nitrogen (N). The thickness (tNE) of the epitaxial layer NE is, for example, about 33 μm, and the impurity concentration thereof is about $3.0 \times 10^{16}$ cm$^{-3}$. Note that the thickness (tNE) of the epitaxial layer NE is designed from the required device withstand voltage and the depth of the deep trenches constituting the super junction, and is typically about 5 to 100 μm. Further, the impurity concentration of the epitaxial layer NE depends on the column width, and it is typically preferable to set it to about $1 \times 10^{15}$ to $1 \times 10^{18}$ cm$^{-3}$.

Figure 17:
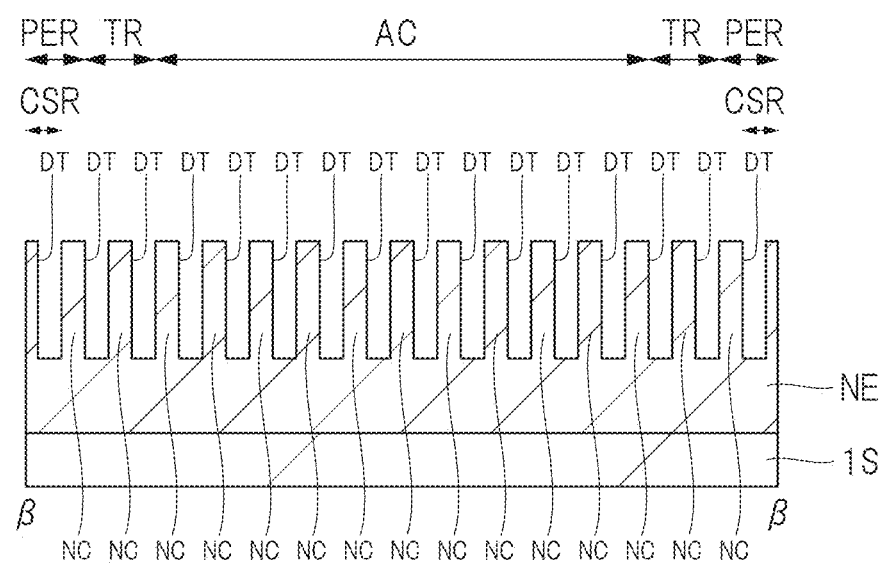
FIG. 17 is a cross-sectional view showing the manufacturing process of the semiconductor device according to the first embodiment.
Figure 18:
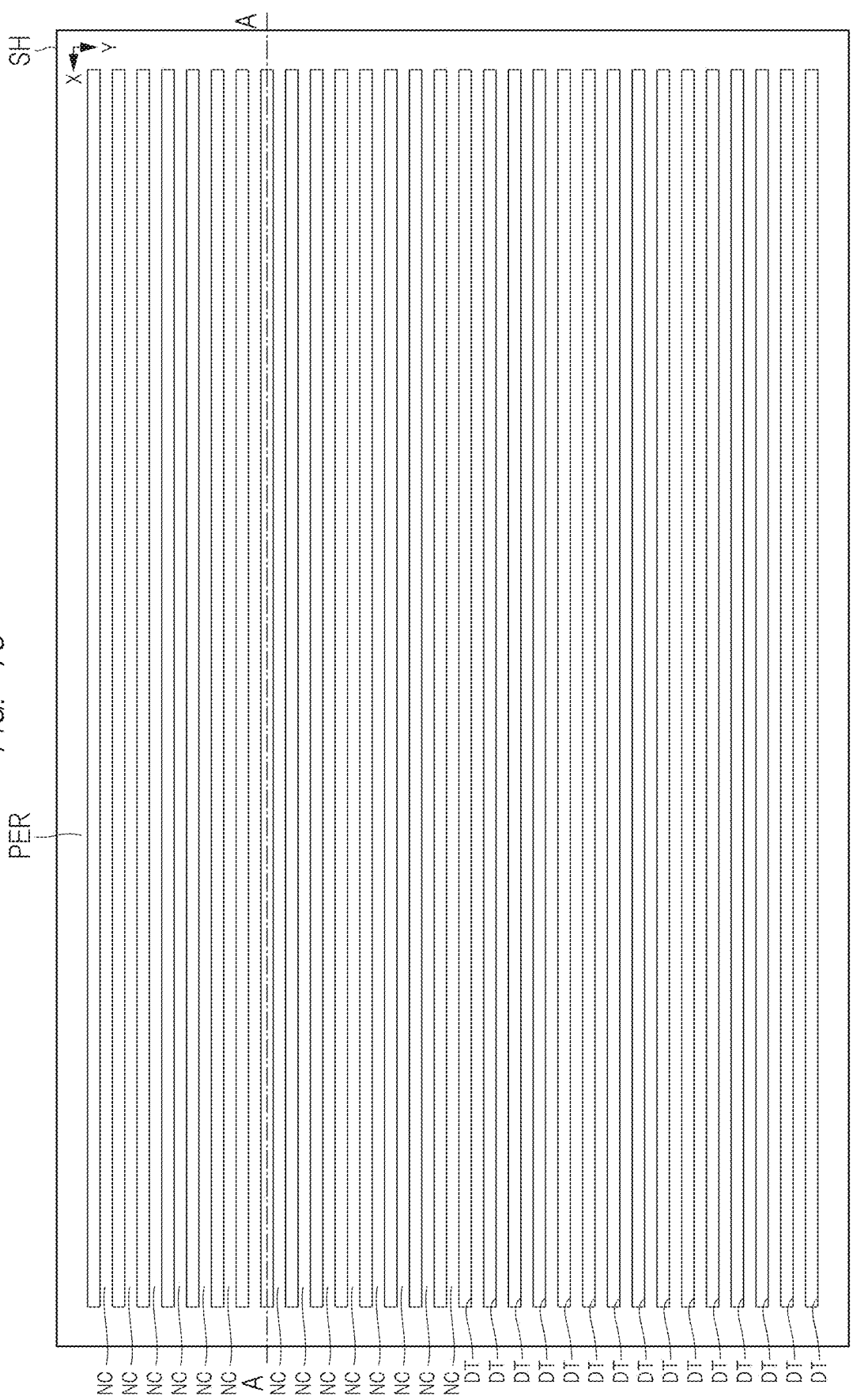
FIG. 18 is a plan view showing the manufacturing process of the semiconductor device according to the first embodiment.

Next, as shown in step S2 of FIG. 15, deep trenches are formed. For example, as shown in FIG. 17, a hard mask (not shown) having an opening on the formation region of the p-type column regions PC of the epitaxial layer NE is formed by using the photolithography and etching techniques. Next, as shown in FIG. 17, the epitaxial layer NE is etched with using the hard mask. As a result, the epitaxial layer NE in the formation region of the p-type column regions PC is removed and the deep trenches DT are formed. The deep trenches DT have a linear shape extending in the X direction (FIG. 18). The length of the deep trench DT in the X direction is, for example, about 9 mm, and the width thereof is about 2 to 3 μm. The repetition cycle (pitch) of the deep trenches DT is about 4 to 6 μm. Specifically, the width can be 2.5 μm and the pitch can be 5 μm. The depth (tDT) of the deep trench DT is about 28 μm. Note that the portion of the epitaxial layer NE between the adjacent deep trenches DT corresponds to the n-type column region NC. Next, the above-mentioned hard mask (not shown) is removed.

Figure 19:
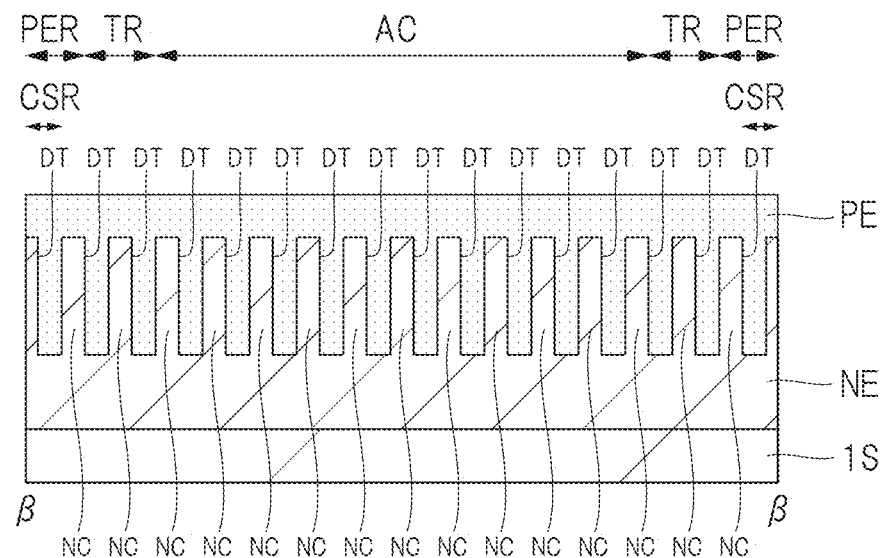
FIG. 19 is a cross-sectional view showing the manufacturing process of the semiconductor device according to the first embodiment.

Then, as shown in step S3 of FIG. 15, formation of a backfilling epitaxial film (film formation of buried p-type epitaxial layer) is performed. For example, as shown in FIG. 19, a buried p-type epitaxial layer PE is formed inside the deep trenches DT and on the epitaxial layer NE by the epitaxial growth method. For example, an epitaxial layer made of SiC is grown while introducing a p-type impurity such as aluminum (Al) or boron (B). At this time, the voids described with reference to FIG. 9, FIG. 10, and the like may be generated.

Figure 20:
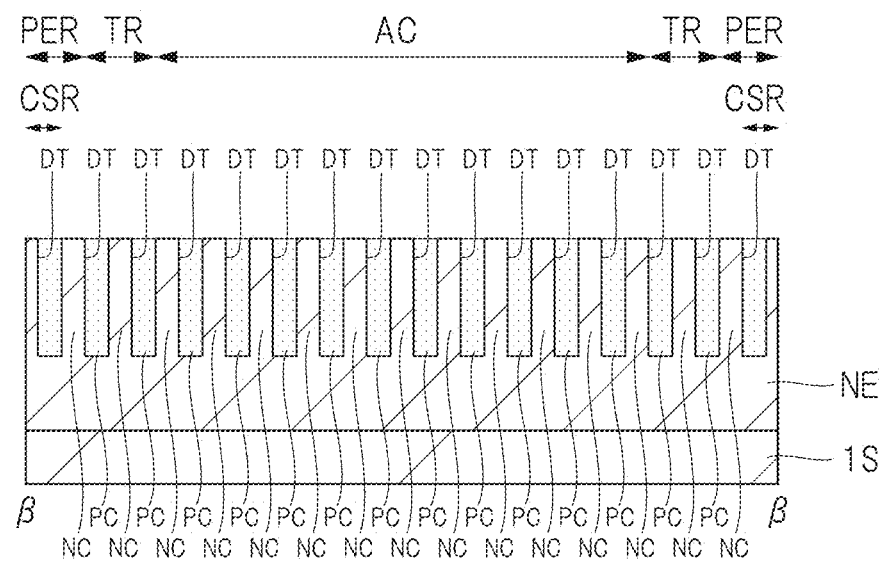
FIG. 20 is a cross-sectional view showing the manufacturing process of the semiconductor device according to the first embodiment.

Next, as shown in step S4 of FIG. 15, planarization is performed. For example, as shown in FIG. 20, the buried p-type epitaxial layer PE on the deep trenches DT is removed by the CMP (Chemical Mechanical Polishing) method, the etch back method, or the like. As a result, the p-type column regions PC made of the buried p-type epitaxial layer (PE) are formed. In other words, an epitaxial layer (super junction structure) including a plurality of p-type column regions PC and a plurality of n-type column regions NC is formed. Since the n-type column region NC is the remaining portion of the epitaxial layer NE, it has the same impurity concentration as that of the epitaxial layer NE. The impurity concentration of the p-type column region PC depends on the SJ structure design and is set to $1 \times 10^{15}$ to $1 \times 10^{18}$ cm$^{-3}$. The impurity concentration of the p-type column region PC is determined from the area and impurity concentration of the n-type column region NC, the area and impurity concentration of the portion of the epitaxial layer NE without the deep trench DT (second semiconductor layer L2), and the area of the p-type column region such that they are charge-balanced.

Figure 21:
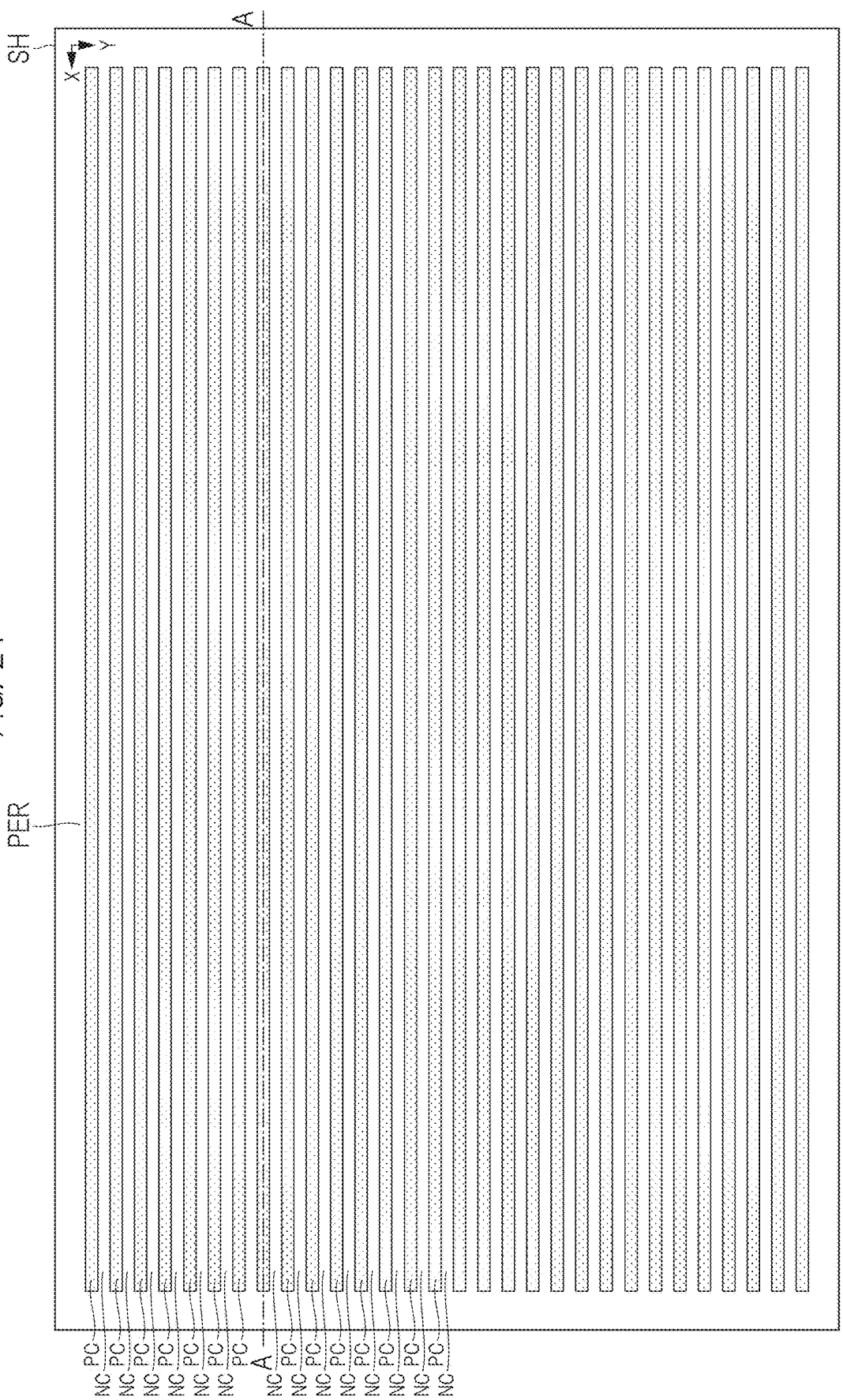
FIG. 21 is a plan view showing the manufacturing process of the semiconductor device according to the first embodiment.

Through the steps above, the super junction structure in which the linear p-type column regions PC extending in the X direction and the linear n-type column regions NC extending in the X direction are alternately and repeatedly arranged in the Y direction in the active region AC, the termination region TR, and the peripheral region PER is formed (FIG. 21).

Figure 22:
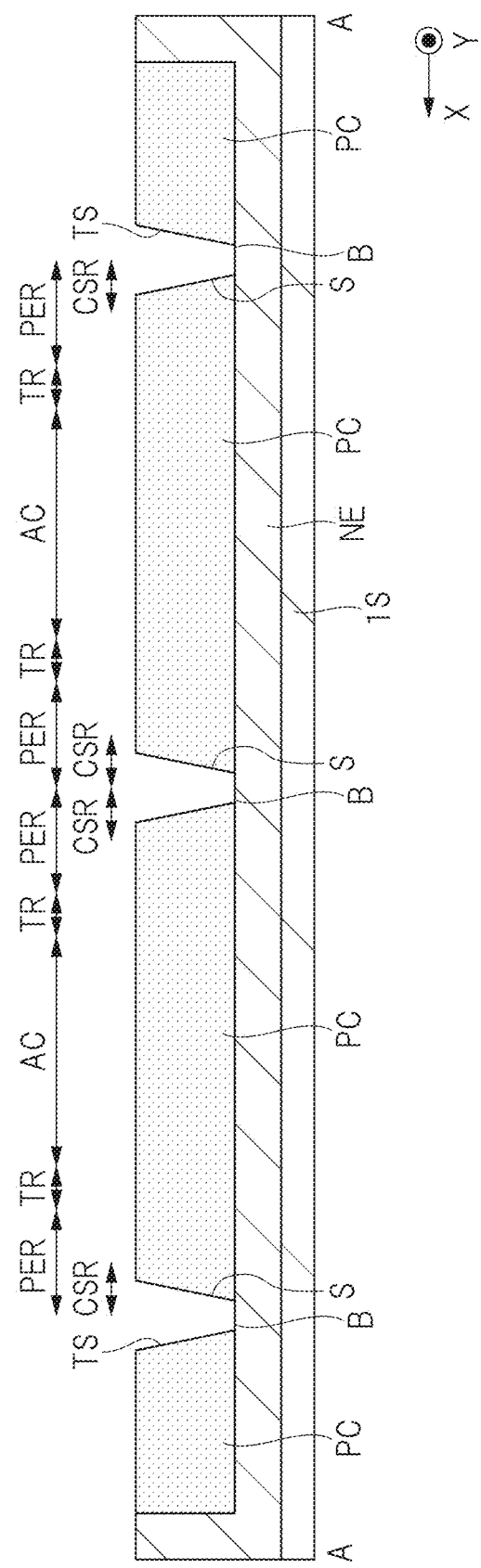
FIG. 22 is a cross-sectional view showing the manufacturing process of the semiconductor device according to the first embodiment.
Figure 23:
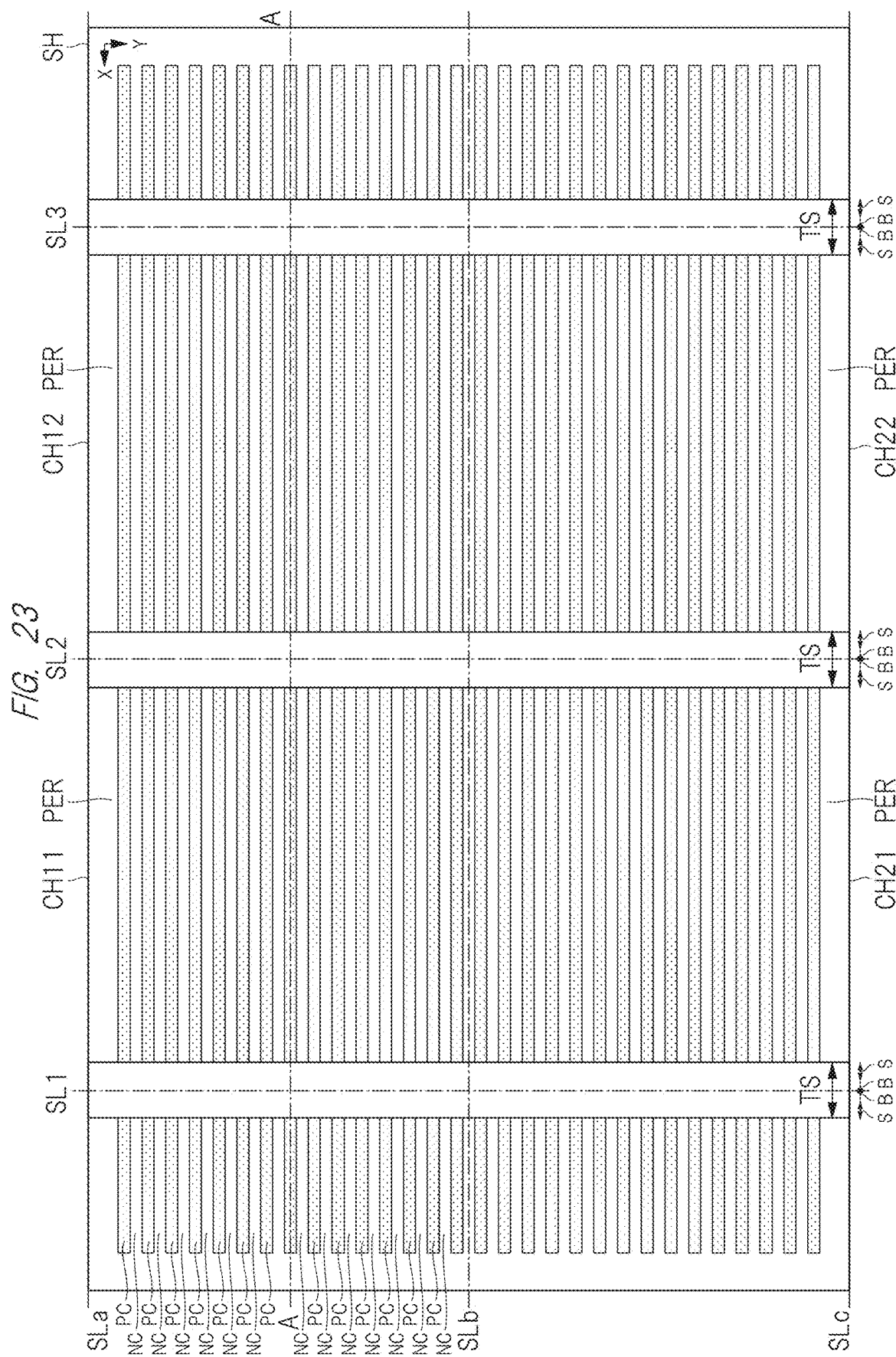
FIG. 23 is a plan view showing the manufacturing process of the semiconductor device according to the first embodiment.

Next, as shown in step S5 of FIG. 15, scribe trenches are formed. For example, as shown in FIGS. 22 and 23, scribe trenches TS are formed in the scribe lines SL1 to SL3 extending in the Y direction. For example, a hard mask (not shown) having an opening on the scribe lines SL1 to SL3 is formed on the super junction structure (p-type column regions PC and n-type column regions NC) by using the photolithography and etching techniques. Then, the super junction structure is etched with using the hard mask. As a result, the super junction structure is removed along the scribe lines SL1 to SL3, and the scribe trenches TS are formed. The scribe trench TS has a linear shape extending in the Y direction (FIG. 23). The depth of the scribe trench TS is equal to or larger than the thickness (depth) of the super junction structure (p-type column regions PC and n-type column regions NC). Also, the vertical depth (tTS=about 30 μm) of the scribe trench TS is equal to or larger than the depth of the deep trench DT (tDT=about 28 μm) and is smaller than the thickness of the epitaxial layer NE (tNE=about 33 μm), and it is not necessary to form the scribe trench TS deeply until reaching the substrate 1S. Since silicon carbide crystal (SiC crystal) is a very hard crystal and etching thereof is difficult, it takes time for the etching of deep trenches. Thus, the device structure in which RIE (Reactive Ion Etching) can be completed before reaching the substrate 1S as described above has advantage in terms of process throughput. Also, each of the scribe trenches TS has side surfaces S and a bottom surface B, and the side surfaces S are tapered. In order to form the scribe trenches TS having such a shape that the side surfaces S are tapered and the bottom surface B is horizontal in the SiC crystal layer, the RIE technique using sulfur hexafluoride ($SF_6$) gas is used. Since SiC crystal is hard to be processed, in order to form the tapered deep trenches, it is necessary to control the retreat etching of the mask while improving the selection ratio of the hard mask. The RIE apparatus includes an upper electrode and a lower electrode facing the upper electrode, and a SiC wafer to be processed is placed and processed on an electrostatic chuck incorporating the lower electrode. At this time, in order to improve the selection ratio, it is effective to control the temperature of the electrostatic chuck (lower electrode) on which the wafer is placed within a range from 50° C. to 100° C. Further, the taper angle can be changed by controlling the retreat of the hard mask in consideration of the power supplied to the lower electrode (high setting: 300 W or more).

For example, the width (length in the X direction) of the bottom surface B before scribing in FIG. 22 is about 100 μm. Also, the width (length in the X direction) of the side surface S is about 17 μm to 30 μm. For example, when the taper angle (tilt angle) of the side surface S is 45°, the width (length in the X direction) of the side surface S is about 30 μm, and the vertical depth to the bottom surface B is about 30 μm. When the taper angle (tilt angle) of the side surface S is 60°, the width (length in the X direction) of the side surface S is about 17 μm, and the vertical depth to the bottom surface B is about 30 μm. Then, the above-mentioned hard mask (not shown) for forming the scribe trench TS is removed.

Figure 24:
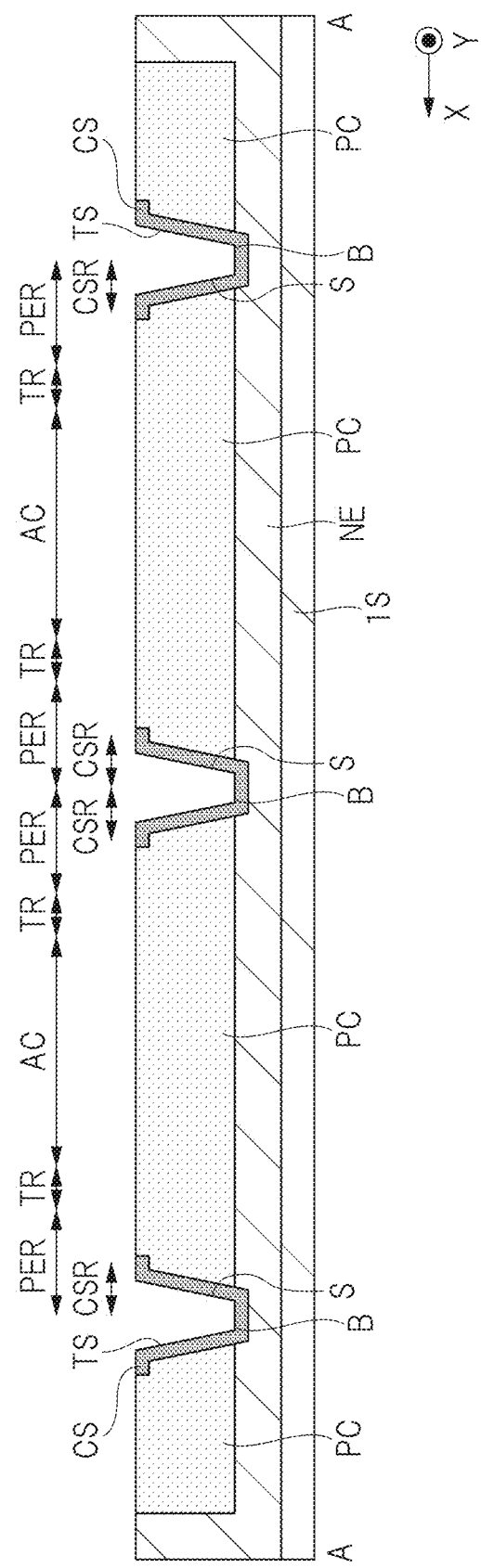
FIG. 24 is a cross-sectional view showing the manufacturing process of the semiconductor device according to the first embodiment.
Figure 25:
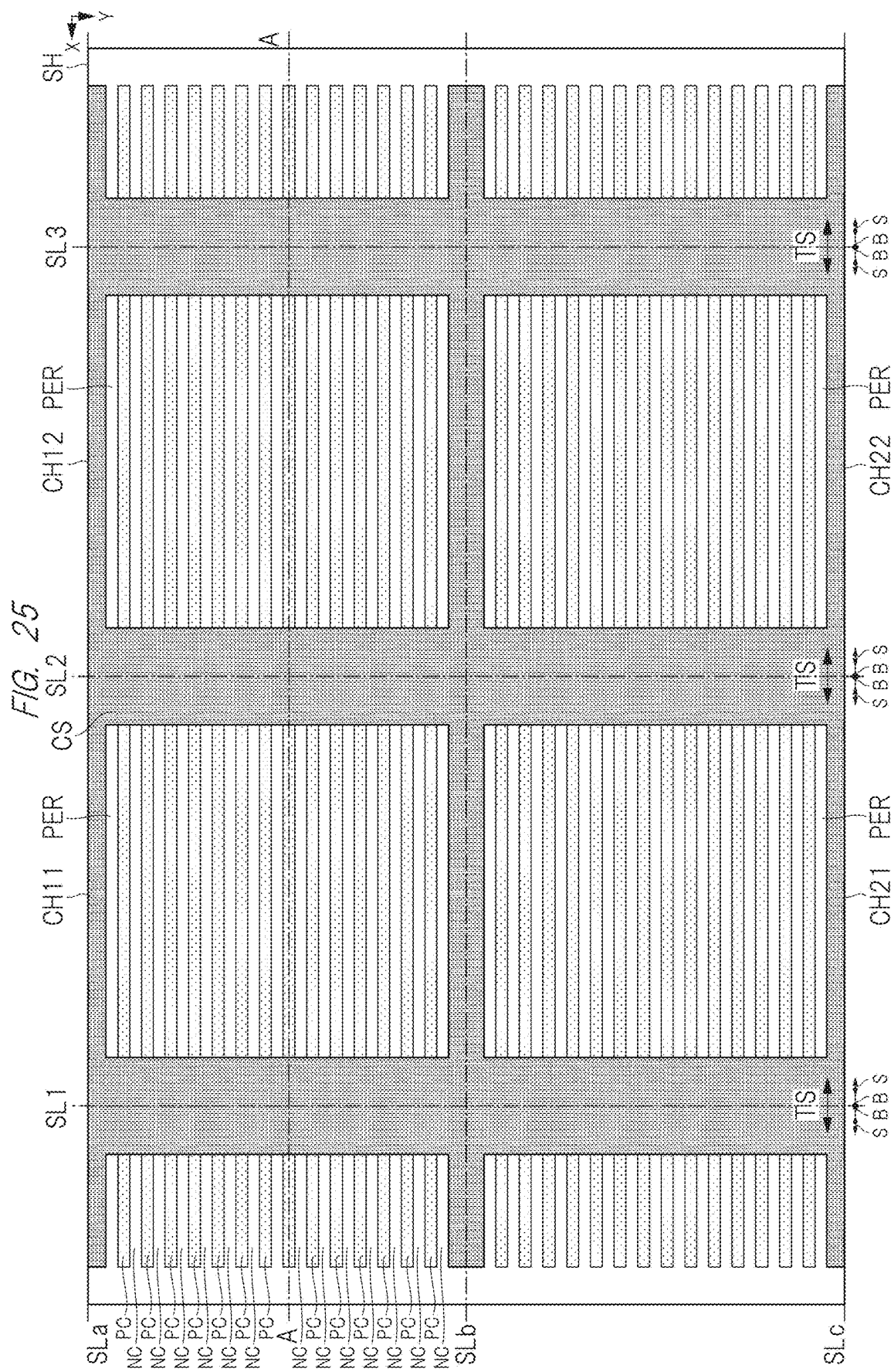
FIG. 25 is a plan view showing the manufacturing process of the semiconductor device according to the first embodiment.

Next, as shown in step S6 of FIG. 15, the channel stopper region is formed by the selective ion implantation method. For example, as shown in FIGS. 24 and 25, the channel stopper region CS is formed by ion implantation in the scribe lines SL1 to SL3 extending in the Y direction and the scribe lines SLa to SLc extending in the X direction. For example, a hard mask (not shown) having an opening on the scribe lines SL1 to SL3 and the scribe lines SLa to SLc is formed by using the photolithography and etching techniques. Then, an n-type impurity such as phosphorus (P) or nitrogen (N) is implanted with using the hard mask (not shown), thereby forming the channel stopper region CS. Note that the n-type impurity may be implanted with using a photoresist film as a mask instead of the hard mask.

Here, since the side surfaces S of the scribe trenches TS are tapered, the channel stopper region CS can be formed so as to cover the side surfaces (exposed surfaces) of the super junction structure (p type column regions PC and n type column regions NC). The concentration of the n-type impurity in the channel stopper region CS is higher than the concentration of the n-type impurity in the epitaxial layer NE, that is, the n-type column regions NC. The concentration of the n-type impurity in the channel stopper region CS is, for example, about $1\times10^{18}$ cm$^{-3}$. The implantation depth of the impurity is about 1 μm from the surface in the horizontal plane. In the case where the impurity is implanted under such conditions, when the taper angle of the side surface S is 45°, the impurity is implanted to the depth of about 0.7 μm in the vertical direction from the surface of the side surface S. Also, when the taper angle of the side surface S is 60°, the impurity is implanted to the depth of about 0.5 μm in the vertical direction from the surface of the side surface S.

In general, the implantation depth (d2) of the impurity in the vertical direction from the surface of the side surface S can be expressed by the following (Expression 1).

$$d2=d1\cdot\sin(90-\theta) \quad \text{(Expression 1)}$$

Here, d1 is the implantation depth of the impurity in the horizontal plane, and θ is the taper angle of the side surface S. Note that θ is based on the horizontal plane (θ=0°), and θ is 90° (θ=90°) when the side surface of the scribe trench TS is vertical.

The charge amount Q1 on the side surface S can be expressed by the following (Expression 2).

$$Q1=n1\cdot d2=n1\cdot d1\cdot\sin(90-\theta) \quad \text{(Expression 2)}$$

Here, n1 is the concentration of the n-type impurity implanted into the side surface S.

On the other hand, the charge amount (Q2) can be expressed by the following (Expression 3).

$$Q2=([\text{dielectric constant of SiC}]\cdot Ec)/(\text{elementary charge } e) \quad \text{(Expression 3)}$$

When the dielectric breakdown field strength (Ec) of the SiC substrate is 3 MV/cm, the charge amount (Q2) is $1.61\times10^{13}$ cm$^{-2}$. Note that [dielectric constant of SiC] is set to $8.59\times10^{-13}$ Fcm$^{-1}$ and elementary charge e is set to $1.6\times10^{-19}$ C.

Since the fact that Q1 is larger than Q2 means that the depletion layer is not exposed on the chip surface, the side surface of the scribe trench TS may be designed such that the charge amount of the side surface S satisfies Q1>Q2. The following (Expression 4) can be obtained from the relationship of Q1>Q2.

$$n1\cdot d1\cdot\sin(90-\theta)>1.61\times10^{13}\text{ cm}^{-2} \quad \text{(Expression 4)}$$

Further, when n1 is $1\times10^{18}$ cm$^{-3}$ and d1 is 1 μm, the following (Expression 5) can be obtained by solving the (Expression 4) for θ.

$$\theta<90-a\sin(0.161)\approx80 \quad \text{(Expression 5)}$$

Namely, under the above-described conditions, the leakage current due to the electric field rise at the end portion of the scribe trench TS can be suppressed if the taper angle is about 80° or less.

As described above, the suitable ion implantation can be performed to the outermost surface of the substrate, the side surface S, and the bottom surface B by the single ion implantation from the vertical direction to the outermost surface of the substrate without requiring the ion implantation from the oblique direction (oblique implantation). Then, the above-mentioned hard mask (not shown) for ion implantation is removed.

Figure 26:
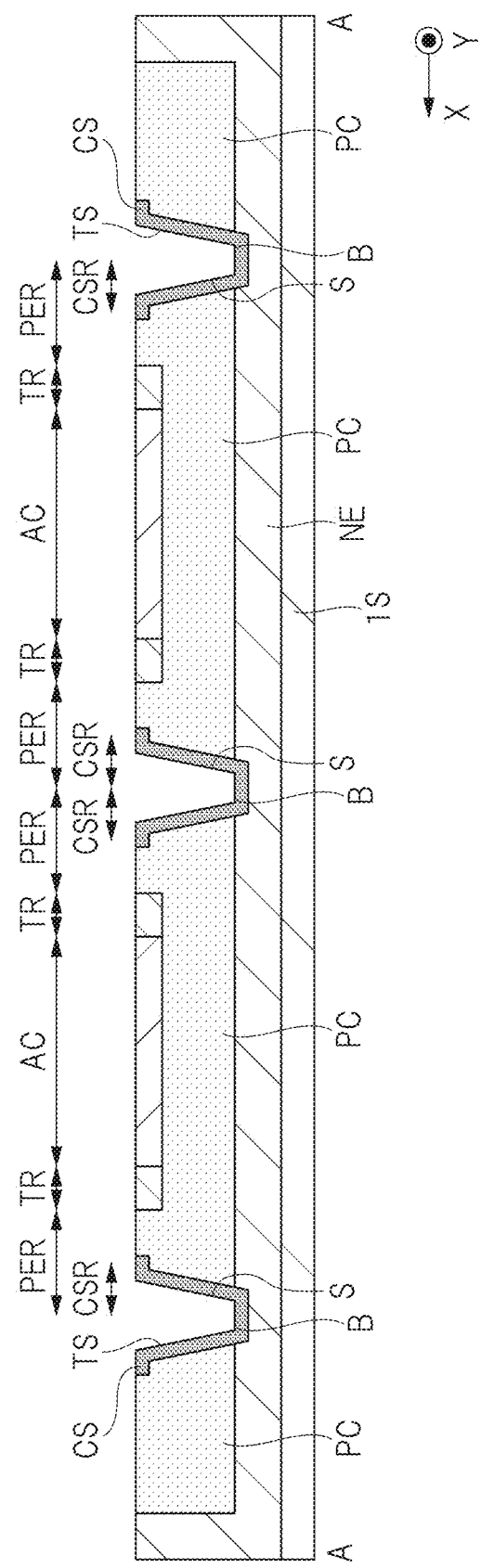
FIG. 26 is a cross-sectional view showing the manufacturing process of the semiconductor device according to the first embodiment.
Figure 27:
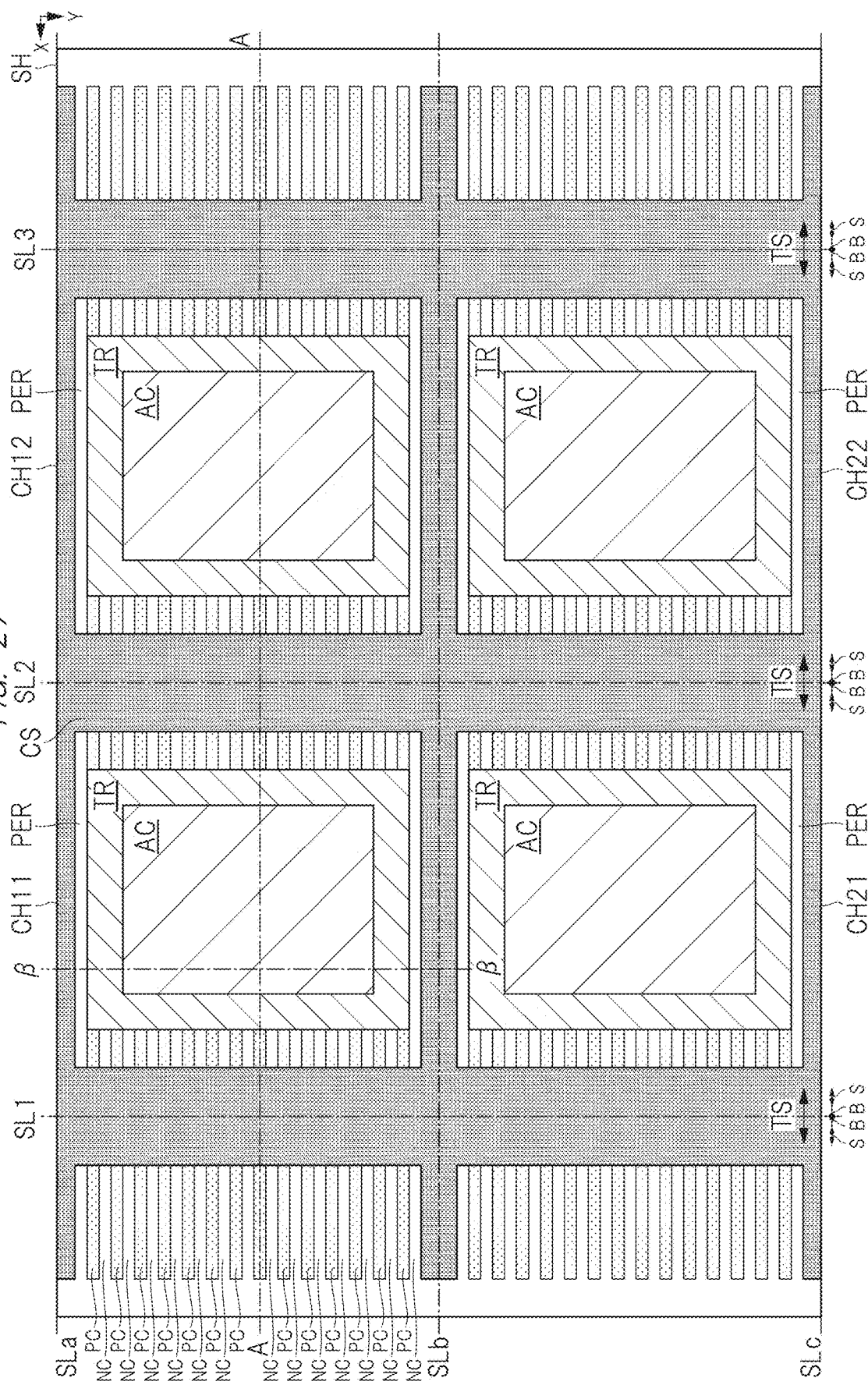
FIG. 27 is a plan view showing the manufacturing process of the semiconductor device according to the first embodiment.

Next, as shown in step S7 of FIG. 15, a transistor structure and the like are formed. For example, as shown in FIGS. 26 and 27, a power device (element) is formed in the active region AC arranged in the center of the substantially rectangular region defined by the channel stopper region CS. Further, a termination structure (semiconductor region) is formed in the termination region TR surrounding the active region AC.

Figure 28:
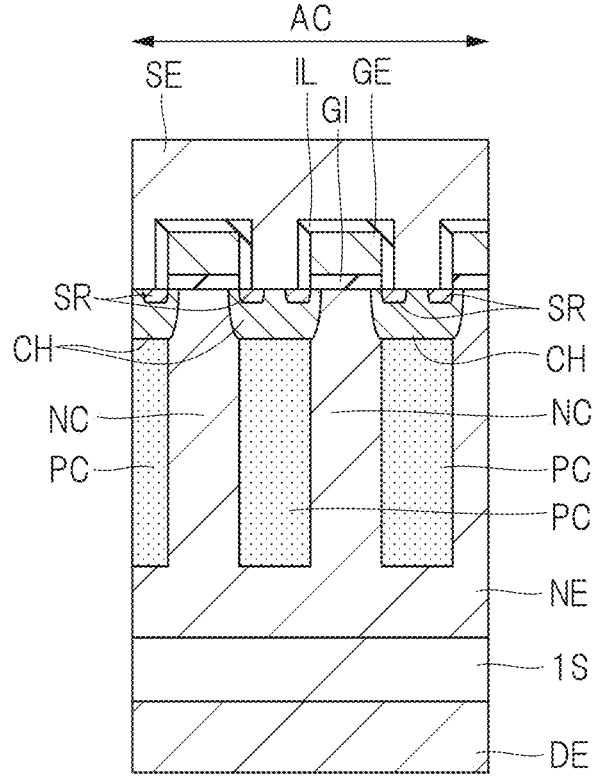
FIG. 28 is a cross-sectional view showing the manufacturing process of the semiconductor device according to the first embodiment.
Figure 29:
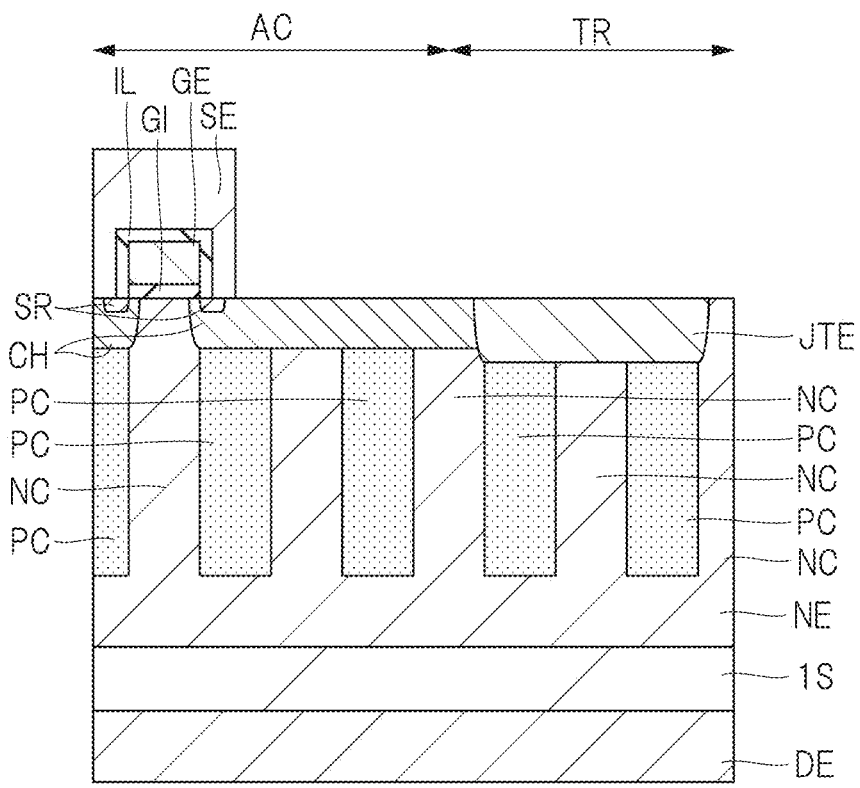
FIG. 29 is a cross-sectional view showing the manufacturing process of the semiconductor device according to the first embodiment.

Although the configuration of the power device is not limited, for example, a vertical MOSFET shown in FIG. 28 is formed. Also, although the configuration of the termination structure formed in the termination region TR is not limited, for example, a p-type semiconductor region JTE shown in FIG. 29 is formed. An example of a process of forming the vertical MOSFET and the p-type semiconductor region JTE will be described with reference to FIGS. 28 and 29.

In the active region AC, a channel region CH is formed by introducing a p-type impurity such as aluminum (Al) or boron (B) by the selective ion implantation method. The selective ion implantation method is a method of selectively introducing the impurity with using a mask film having an opening on an impurity implantation region as a mask. At this time, also in the termination region TR, the p-type semiconductor region JTE is formed by introducing the p-type impurity. The p-type semiconductor region JTE is provided so as to surround the active region AC. JTE is an abbreviation for "Junction Termination Extension" and is a type of termination structure.

Next, in the active region AC, a source region SR is formed by introducing an n-type impurity by the selective ion implantation method. The source region SR is formed in the channel region CH.

Next, a gate insulating film GI is formed on the super junction structure (p type column regions PC and n type column regions NC), and a conductor film is formed on this gate insulating film GI. The gate insulating film GI is made of, for example, silicon oxide and is formed by, for example, the CVD (Chemical Vapor Deposition) method. Alternatively, it may be formed by the thermal oxidation method. The gate insulating film GI is not limited to the silicon oxide film, but may be, for example, a high dielectric constant film such as a hafnium oxide film. The conductor film is made of, for example, polycrystalline silicon and is formed by, for example, the CVD method.

Next, a gate electrode GE is formed by patterning the conductor film. Then, an interlayer insulating film IL is formed on the gate electrode GE. The interlayer insulating film IL is made of, for example, silicon oxide and is formed by, for example, the CVD method.

Next, a contact hole is formed by removing the interlayer insulating film IL having the bottom portion on the source region SR and the channel region CH by etching.

Next, a metal film is formed in the contact hole and on the interlayer insulating film IL and is then patterned to form a source electrode SE. For example, the source electrode SE is formed by forming a metal film such as an Al film by the sputtering method or the like and then processing the metal film into a desired shape by using photolithography and etching techniques.

Next, after a surface protective film (not shown) is formed so as to cover the source electrode SE, a part of the source electrode SE and the like is exposed by patterning the surface protective film, thereby forming an external connection region (pad region).

Next, after a back surface of the SiC substrate 1S is ground to reduce the thickness of the SiC substrate 1S, a metal film to be a drain electrode DE is formed on the back surface of the SiC substrate 1S by the sputtering method or the like. For example, a metal film such as an Al film is formed by the sputtering method or the like. In this manner, the vertical MOSFET and the p-type semiconductor region JTE can be formed.

Next, by cutting the scribe lines (SL1 to SL3, SLa to SLc) of the wafer-shaped semiconductor device (semiconductor wafer W) by a dicer or the like, the wafer is singulated for each semiconductor chip region, thereby obtaining a plurality of semiconductor chips.

As described above, the semiconductor device according to this embodiment can be formed. Although the p-type semiconductor region JTE is used as the termination structure in FIG. 29, an FLR (Field Limiting Ring) structure having a plurality of p-type semiconductor regions annularly surrounding the active region AC may be used as the termination structure.

Second Embodiment

In this embodiment, application examples of the first embodiment will be described. Components having the same function as those of the first embodiment are denoted by the same reference characters, and the repetitive description thereof will be omitted.

First Application Example

Figure 30:
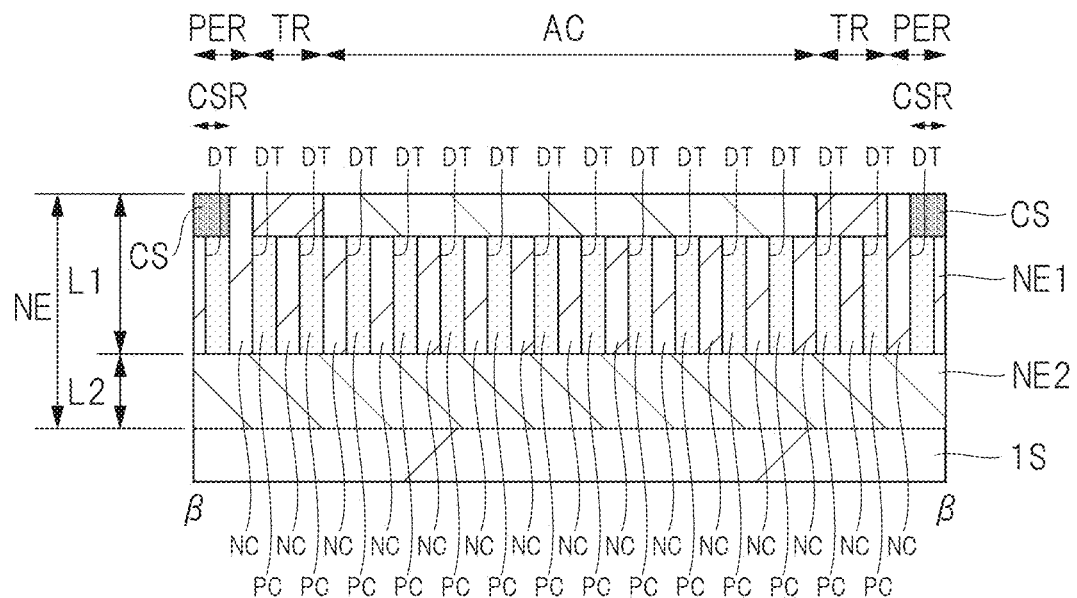
FIG. 30 is a cross-sectional view schematically showing a configuration of a semiconductor device of a first application example according to the second embodiment.

FIG. 30 is a cross-sectional view schematically showing a configuration of a semiconductor device of a first application example according to this embodiment. In this application example, the following points are changed from the first embodiment. In the first embodiment (for example, FIG. 4), the epitaxial layer NE is formed of a single layer (single impurity layer), but in this application example, the epitaxial layer is formed to have a two-layer structure including a first epitaxial layer NE1 (SJ structure epitaxial layer) and a second epitaxial layer NE2 (buffer layer) having a different impurity concentration from the first epitaxial layer NE1. As to the first epitaxial layer NE1 (SJ structure epitaxial layer), for example, the thickness thereof is about 24 μm, and the impurity concentration thereof is about $1.5 \times 10^{16}$ cm$^{-3}$. Also, as to the second epitaxial layer NE2 (buffer layer), for example, the thickness thereof is about 40 μm and the impurity concentration thereof is about $2 \times 10^{15}$ cm$^{-3}$. As described above, it is preferable that the impurity concentration of the second epitaxial layer NE2 is lower than the impurity concentration of the first epitaxial layer NE1, and it is more preferable that the impurity concentration of the second epitaxial layer NE2 is half or lower than the impurity concentration of the first epitaxial layer NE1. With such a configuration, the amount of excess carriers accumulated in the buffer layer at the time of reverse recovery can be increased and the tail current at the time of reverse recovery can be increased, so that the softer recovery can be achieved.

In this application example, the thickness of the first epitaxial layer NE1 and the thickness of the first semiconductor layer L1 are equal to each other, and the thickness of the second epitaxial layer NE2 and the thickness of the second semiconductor layer L2 are equal to each other. However, since the thickness of the first semiconductor layer L1 is determined by the depth of the deep trench DT, it varies due to manufacturing variations. The variation of about ±2 μm with respect to the thickness of the first epitaxial layer NE1 is permitted in the depth of the deep trench DT. Therefore, the thickness of the first epitaxial layer NE1 and the thickness of the first semiconductor layer L1 are not completely equal to each other, but the n-type column regions NC of the first semiconductor layer L1 are substantially formed by the first epitaxial layer NE1.

Figure 31:
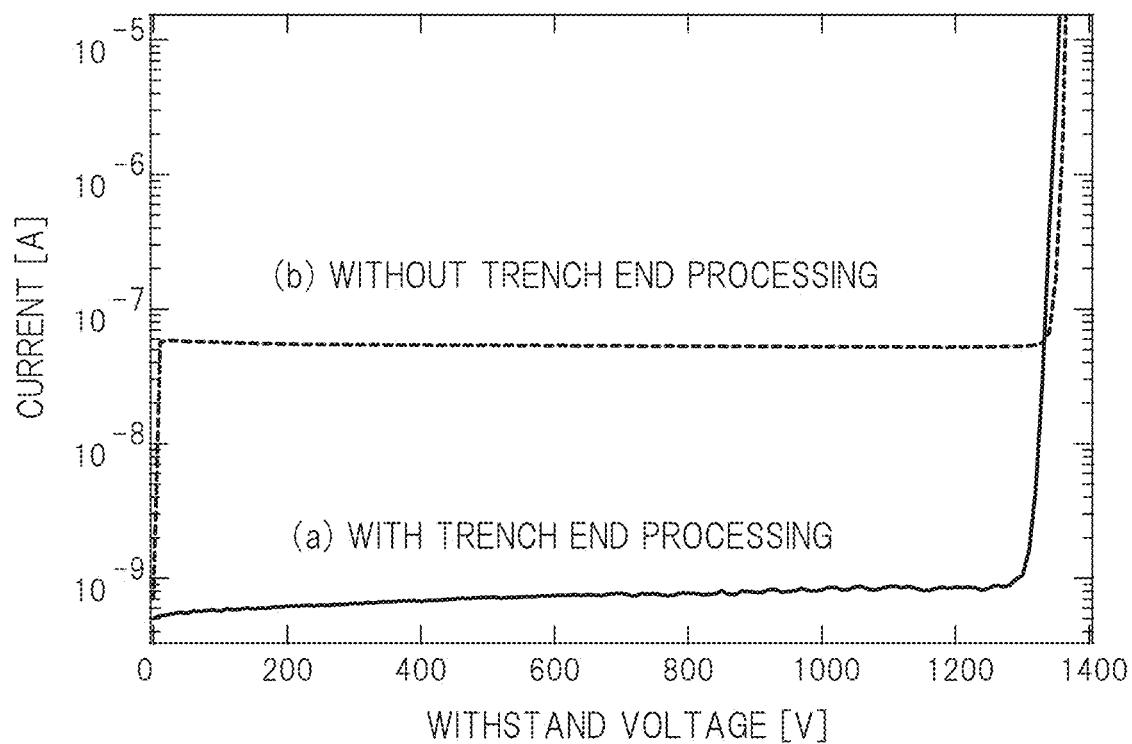
FIG. 31 is a diagram showing measurement results of leakage current in the semiconductor device of the first application example according to the second embodiment.

FIG. 31 is a graph showing current-voltage characteristics when a reverse bias is applied to the pn junction (diode TEG) in the semiconductor device of this application example. The graph (a) shows the case of the semiconductor device of this application example, that is, the device "with trench end processing", and the graph (b) shows the case of a comparative example, that is, the device "without trench end processing", which is directly scribed without performing the scribe trench formation step and the ion implantation step steps (S5, S6).

In the devices of (a) and (b), the thickness (tNE) of the epitaxial layer NE is 64 μm, the depth (tDT) of the deep trench DT is 24 μm, the vertical depth (tTS) of the scribe trench is 30 μm, and the taper angle of the side surface S is 60°. In the case of the solid line graph (a) corresponding to this application example, the current is reduced to about $\frac{1}{100}$ in the range of the withstand voltage of 0 to about 1200 V compared with the case of the broken line graph (b) corresponding to the comparative example. It can be understood that the leakage current caused by the exposed super junction structure is generated in the case of the comparative example (b), whereas the leakage current is suppressed in the case of this application example (a). In this way, the leakage current can be reduced by performing the trench end processing.

Second Application Example

Figure 32:
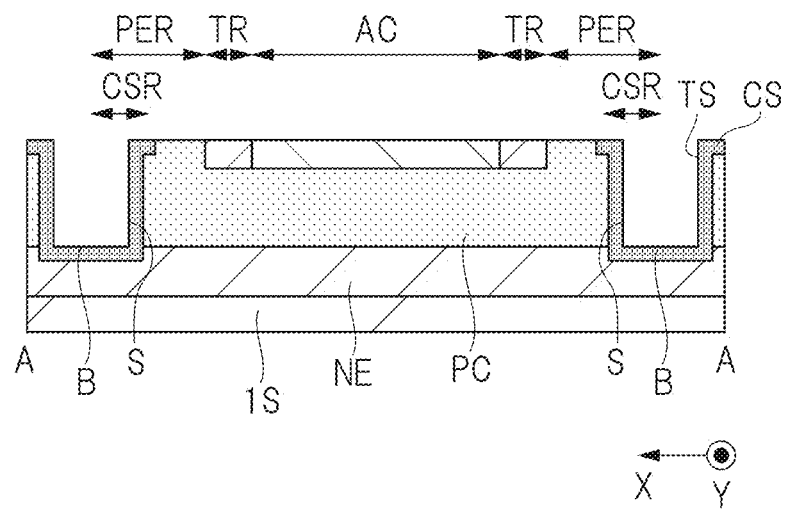
FIG. 32 is a cross-sectional view schematically showing a configuration of a semiconductor device of a second application example according to the second embodiment.

FIG. 32 is a cross-sectional view schematically showing a configuration of a semiconductor device of a second application example according to this embodiment. In the first embodiment (FIG. 6), the scribe trenches TS are formed such that the side surfaces S are tapered, but the side surfaces of the scribe trenches TS may be substantially vertical as shown in FIG. 32. The cross-sectional shape of the scribe trenches TS can be controlled by adjusting the etching conditions.

When the side surfaces S of the scribe trenches TS are substantially vertical in this manner, the channel stopper region CS is formed by oblique ion implantation. Note that the oblique ion implantation may be used even when the side surfaces of the scribe trenches TS are tapered.

Third Application Example

Figure 33:
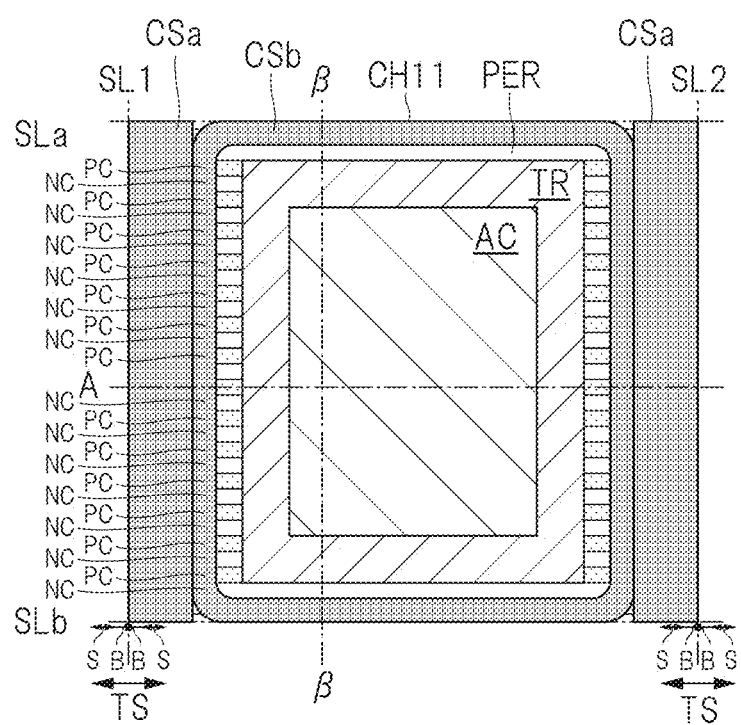
FIG. 33 is a plan view schematically showing a configuration of a semiconductor device of a third application example according to the second embodiment.

FIG. 33 is a plan view schematically showing a configuration of a semiconductor device of a third application example according to this embodiment. In the first embodiment (FIGS. 2 and 5), the channel stopper region CS is formed by ion implantation in the scribe lines SL1 to SL3 extending in the Y direction and the scribe lines SLa to SLc extending in the X direction, but the ion implantation may be separately performed to the scribe lines SL1 to SL3 extending in the Y direction and the scribe lines SLa to SLc extending in the X direction.

For example, it is possible to form channel stopper regions CSa by ion implantation in the scribe lines SL1 to SL3 extending in the Y direction, and then form channel stopper regions CSb by ion implantation in the scribe lines SLa to SLc extending in the X direction. At this time, the channel stopper region CSb may be formed so as to surround the termination region TR (FIG. 33).

Fourth Application Example

Figure 34:
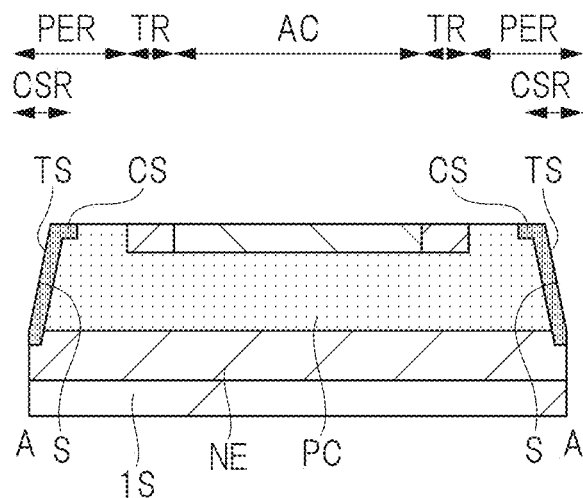
FIG. 34 is a cross-sectional view schematically showing a configuration of a semiconductor device of a fourth application example according to the second embodiment.

FIG. 34 is a cross-sectional view schematically showing a configuration of a semiconductor device of a fourth application example according to this embodiment. In the first embodiment (FIG. 3), the wafer is cut such that not only the side surfaces S of the scribe trenches TS but also the bottom surfaces B remain, but the wafer may be cut such that the bottom surfaces B do not remain.

For example, the semiconductor devices (see FIGS. 5 and 8) formed on the semiconductor wafer are divided into chips by cutting the tape-mounted semiconductor wafer into individual pieces with a diamond blade rotated at high speed. At this time, the semiconductor wafer corresponding to the width of the diamond blade is scraped off on the scribe line.

Therefore, when the entire width of each bottom surface B is designed to be narrowed to be equal to or smaller than the cutting width of the diamond blade in FIG. 6 described above, the bottom surface B shown in FIG. 3 does not remain, and the shape shown in FIG. 34 is obtained. Note that, in the sixth application example (FIG. 36) described later, the bottom surface B is made substantially 0, and the semiconductor device formed into a chip has the same configuration as that in FIG. 34.

Fifth Application Example

Figure 35:
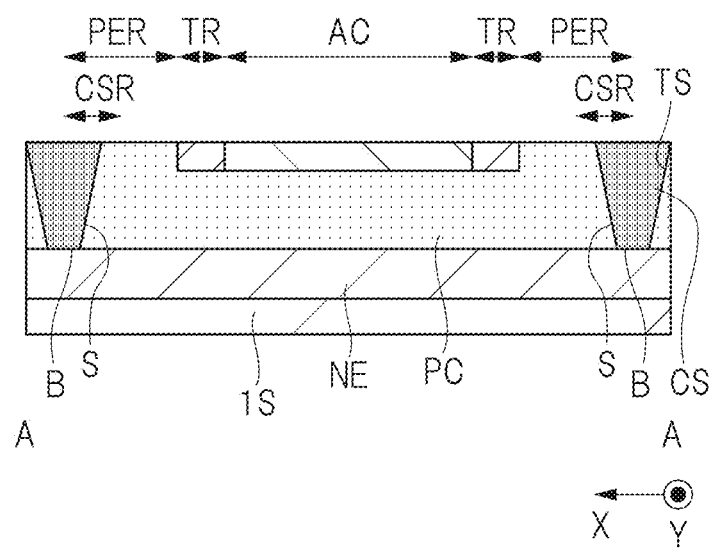
FIG. 35 is a cross-sectional view schematically showing a configuration of a semiconductor device of a fifth application example according to the second embodiment.

FIG. 35 is a cross-sectional view schematically showing a configuration of a semiconductor device of a fifth application example according to this embodiment. In the first embodiment (FIG. 6), the channel stopper region CS is formed by ion implantation, but the channel stopper region CS may be formed by filling the scribe trenches TS with an n-type epitaxial layer (FIG. 35). For example, a buried n-type epitaxial layer is formed inside the scribe trenches TS and on the epitaxial layer NE by the epitaxial growth method. For example, an epitaxial layer made of SiC is grown while introducing an n-type impurity. Then, the buried n-type epitaxial layer is removed by the CMP or the etch back method until the epitaxial layer (super junction structure) NE is exposed.

Sixth Application Example

Figure 36:
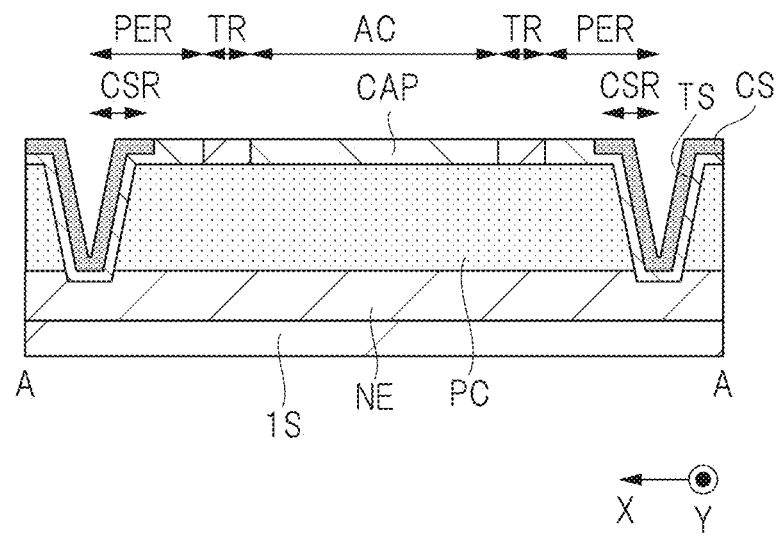
FIG. 36 is a cross-sectional view schematically showing a configuration of a semiconductor device of a sixth application example according to the second embodiment.

FIG. 36 is a cross-sectional view schematically showing a configuration of a semiconductor device of a sixth application example according to this embodiment. In the first embodiment (FIG. 6), the channel stopper region CS is formed after the scribe trenches TS are formed, but it is also possible to form the channel stopper region CS by the ion implantation after the scribe trenches TS are formed and an n-type epitaxial layer is formed as a cap layer CAP on the epitaxial layer (super junction structure) NE including the inside of the scribe trenches TS. Note that, in this case, the cap layer (n-type epitaxial layer) CAP is also formed in the active region AC and the termination region TR. For example, the semiconductor regions (SR, CH, JTE) constituting the vertical MOSFET and the p-type semiconductor region JTE may be formed in the cap layer (n-type epitaxial layer) CAP.

Seventh Application Example

In the first embodiment (FIG. 5), the formation region of four semiconductor devices (semiconductor chips) including two semiconductor devices in the X direction and two semiconductor devices in the Y direction (2×2) is defined as one-shot exposure region, but the formation region of, for example, nine (3×3) semiconductor devices and sixteen (4×4) semiconductor devices (semiconductor chips) may be defined as the one-shot exposure region. By increasing the one-shot exposure region (increasing the lengths of the p-type column regions PC and the n-type column regions NC in the X direction in a plan view (for example, FIG. 21)), the ratio of the void region (invalid region, see FIG. 11) to be cut off (cut out) to the area of the semiconductor wafer is reduced. As a result, the area efficiency of the semiconductor device (semiconductor chip) is improved.

Eighth Application Example

Figure 37:
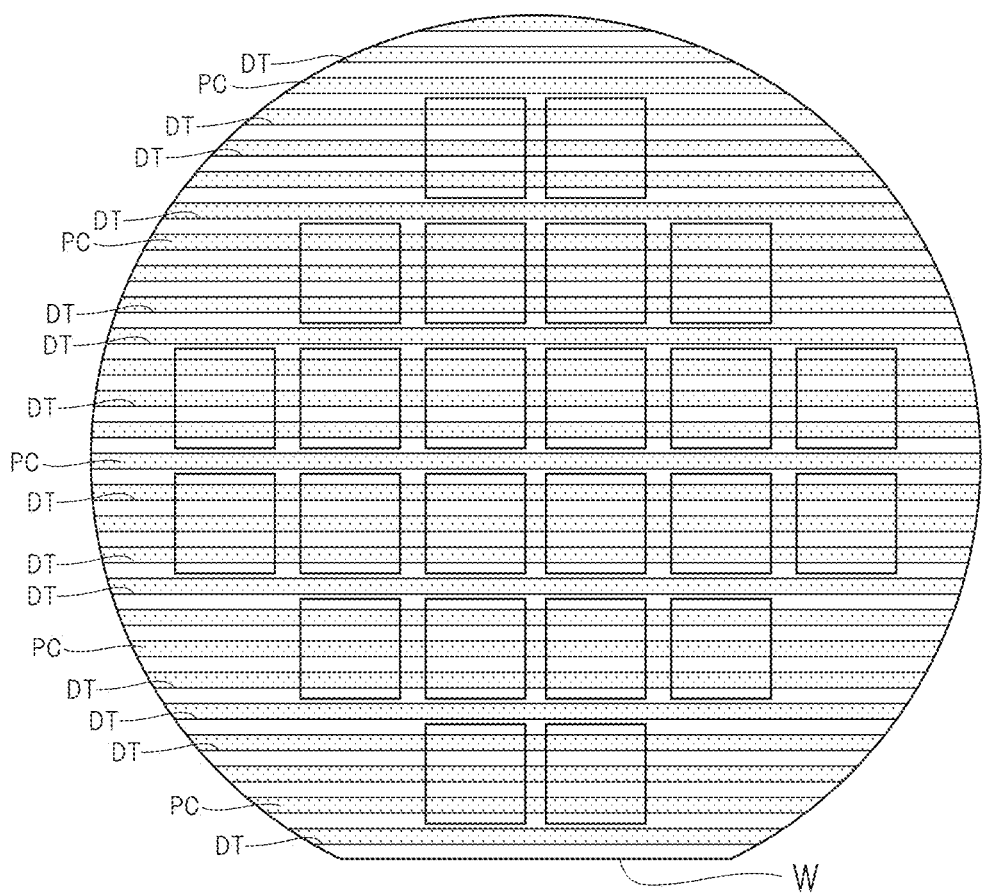
FIG. 37 is a plan view schematically showing a configuration of a semiconductor device of an eighth application example according to the second embodiment.

FIG. 37 is a plan view schematically showing a configuration of a semiconductor device of an eighth application example according to this embodiment. As shown in FIG. 37, the deep trenches DT may be made to extend from one end to the other end of the semiconductor wafer W. Note that, in FIG. 37, the number of deep trenches DT to be illustrated is reduced for the sake of easy understanding of the drawing.

In this application example, the uniformity of epitaxial growth is improved. Namely, the p-type semiconductor region is epitaxially grown from the opposing side surfaces and the bottom surface in any part of the deep trench DT. Accordingly, the generation of the voids VD can be suppressed.

Also in the case of this application example, it is necessary to divide the semiconductor devices (semiconductor chips) so as to cross the p-type column regions PC extending in the X direction, and the characteristics of the semiconductor device can be improved by covering the side surfaces of the super junction structure described in the first embodiment with the channel stopper region CS.

The invention made by the inventors of the present invention has been specifically described above based on the embodiments, but it goes without saying that the present invention is not limited to the above embodiments, and various modifications can be made without departing from the scope of the invention.

Note that the numbers of the n-type column regions NC and the p-type column regions PC shown in the drawings for describing the first and second embodiments above are simplified for convenience of description of the drawings, and do not match with the actual scale. For example, in FIG. 4, one p-type column region PC is drawn in the width of the channel stopper formation region CSR, but this is merely a schematic image. The width of the channel stopper formation region CSR in an actual device is, for example, about 100 to 200 μm. On the other hand, if the width of about 2 μm is adopted as the width of each of the p-type column regions PC and the n-type column regions NC, the width of one cycle is 4 μm. Therefore, about 25 to 50 cycles of the p-type column regions PC and the n-type column regions NC exist in the channel stopper formation region CSR of the actual device.

Further, the order of the processes (steps) shown in FIG. 15 may be changed, so that the scribe trench formation and the ion implantation (S5, S6) may be performed in the middle of the transistor structure formation process (S7). Namely, after the steps S1 to S4 are completed, the process up to right before the activation annealing after the ion implantation in the transistor structure is performed as the first transistor formation process. Thereafter, the scribe trench formation and the ion implantation (S5, S6) are performed, and the activation annealing process of the impurity implanted in the transistor structure and the scribe trenches is performed. In this manner, the ion implantation process in the transistor structure formation process can be performed for a semiconductor wafer in a flat state in which the scribe trenches are not yet formed, and the process such as photolithography can be advantageously performed.

Further, in the first and second embodiments described above, the SiC epitaxial layer (NE, NE1, NE2) to be the so-called drift layer is provided so as to be in direct contact with the SiC semiconductor substrate 1S, but an intermediate layer made of a single layer or a plurality of layers of SiC may be provided between the SiC semiconductor substrate 1S and the SiC epitaxial layer. As the intermediate layer, a buffer layer for the purpose of preventing stacking faults, a collector layer in an IGBT, a field stop layer, and the like are known. Therefore, the configuration having the SiC epitaxial layer on the SiC semiconductor substrate includes not only the configuration in which the SiC epitaxial layer is directly formed but also the configuration having the intermediate layer as described above.

(Supplementary Note 1)

A manufacturing method of a semiconductor device having a super junction structure including a plurality of first semiconductor pillars of a first conductivity type and a plurality of second semiconductor pillars of a second conductivity type opposite to the first conductivity type, which are formed in a first epitaxial layer on a substrate layer, the manufacturing method including the steps of:

(a) preparing a semiconductor substrate having the substrate layer and the first epitaxial layer on the substrate layer;

(b) forming a plurality of first trenches having a depth smaller than a thickness of the epitaxial layer in the first epitaxial layer, thereby forming the plurality of first semiconductor pillars;

(c) forming a buried semiconductor film of the second conductivity type in the first trenches, thereby forming the second semiconductor pillars;

(d) forming second trenches having a depth smaller than the thickness of the epitaxial layer and larger than the depth of the first trenches in scribe regions that cross the first and second semiconductor pillars;

(e) forming a channel stopper region of the first conductivity type in the second trenches;

(f) forming an element on the super junction structure; and (g) cutting the scribe regions to separate the semiconductor substrate into individual pieces.

(Supplementary Note 2)

In the manufacturing method of a semiconductor device according to Supplementary Note 1, voids in the first trenches outside the scribe regions are cut off in the step (g).

(Supplementary Note 3)

In the manufacturing method of a semiconductor device according to Supplementary Note 1, the step (e) is an ion implantation step of an impurity of the first conductivity type into the side surfaces and the bottom surfaces of the second trenches.

(Supplementary Note 4)

In the manufacturing method of a semiconductor device according to any one of Supplementary Notes 1 to 3, the second trenches having tapered side surfaces and flat bottom surfaces are formed by RIE in the step (d).

(Supplementary Note 5)

In the manufacturing method of a semiconductor device according to Supplementary Note 1, the step (e) is a step of filling the second trenches with a semiconductor region of the first conductivity type.

(Supplementary Note 6)

The manufacturing method of a semiconductor device according to Supplementary Note 1 further including a step of forming a second epitaxial layer on the first epitaxial layer including inside of the second trenches between the step (d) and the step (e).

REFERENCE SIGNS LIST

1S: substrate
AC: active region
B: bottom surface
CAP: cap layer
CEP1: first chip end portion
CEP2: second chip end portion
CH: channel region
CH11: semiconductor chip
CH12: semiconductor chip
CH21: semiconductor chip
CH22: semiconductor chip
CS: channel stopper region
CSa: channel stopper region
CSb: channel stopper region
CSR: channel stopper formation region
DE: drain electrode
DT: deep trench
GE: gate electrode
GI: gate insulating film
IL: interlayer insulating film
JTE: p-type semiconductor region
NC: n-type column region
NE: epitaxial layer
PC: p-type column region
PE: buried p-type epitaxial layer
PER: peripheral region
S: side surface (first side surface)
SS2: second side surface
S1-S7: step
SE: source electrode
SH: region (one-shot exposure region)
SL1-SL3: scribe line
SLa-SLc: scribe line
SR: source region
TR: termination region
TS: scribe trench
VD: void
W: semiconductor wafer
L1: first semiconductor layer
L2: second semiconductor layer
NE1: first epitaxial layer (SJ structure epitaxial layer)
NE2: second epitaxial layer (buffer layer)

The invention claimed is:

1. A semiconductor device comprising:
a SiC semiconductor substrate of a first conductivity type;
a SiC epitaxial layer of the first conductivity type provided on the SiC semiconductor substrate and having an impurity concentration lower than that of the SiC semiconductor substrate;
a first semiconductor layer provided as a part of the SiC epitaxial layer and including first semiconductor pillars of the first conductivity type and second semiconductor pillars of a second conductivity type which extend in a first direction and are arranged alternately and repeatedly in a main surface of the SiC semiconductor substrate;
a second semiconductor layer of the first conductivity type, which is a layer other than the first semiconductor layer in the SiC epitaxial layer and located between the SiC semiconductor substrate and the first semiconductor layer;
a device active region provided on a main surface of the first semiconductor layer;
a termination region provided on the main surface of the first semiconductor layer and surrounding the device active region;
a channel stopper region of the first conductivity type provided on the main surface of the first semiconductor layer, surrounding the termination region, and having an impurity concentration higher than that of the SiC epitaxial layer; and
a plurality of first chip end portions parallel to a second direction intersecting with the first direction and a plurality of second chip end portions parallel to the first direction, the first chip end portions and the second chip end portions being provided so as to define a quadrilateral semiconductor chip,
wherein the first chip end portion includes a first side surface having a height of a cross-section from the first semiconductor layer to a middle of the second semiconductor layer and a second side surface having a height from the middle of the second semiconductor layer to a back surface of the semiconductor substrate, and
in the first chip end portion, a surface of the first side surface is covered with an impurity region of the first conductivity type having an impurity concentration higher than those of the first semiconductor pillar and the SiC epitaxial layer and is connected to the channel stopper region.

2. The semiconductor device according to claim 1,
wherein the plurality of first chip end portions each have a bottom surface which connects a lower portion of the first side surface and an upper portion of the second side surface and has a horizontal plane in the second semiconductor layer, and
at least the first side surface and the bottom surface are covered with the impurity region.

3. The semiconductor device according to claim 2,
wherein the first side surface is tapered.

4. The semiconductor device according to claim 2,
wherein the SiC epitaxial layer includes a first epitaxial layer serving as an upper layer and a second epitaxial layer serving as a lower layer and having an impurity concentration half or lower than that of the first epitaxial layer, and
the first semiconductor pillars are substantially formed of the first epitaxial layer.

5. The semiconductor device according to claim 3,
wherein an angle of the first side surface is 80 degrees or less based on a horizontal plane.

6. The semiconductor device according to claim 2,
wherein the channel stopper region is in contact with the first semiconductor pillars and the second semiconductor pillars at the first chip end portions.

7. The semiconductor device according to claim 2,
wherein a MOSFET is formed in the device active region.

8. The semiconductor device according to claim 3,
wherein the SiC epitaxial layer includes a first epitaxial layer serving as an upper layer and a second epitaxial layer serving as a lower layer and having an impurity concentration half or lower than that of the first epitaxial layer, and
the first semiconductor pillars are substantially formed of the first epitaxial layer.

9. The semiconductor device according to claim 3,
wherein the channel stopper region is in contact with the first semiconductor pillars and the second semiconductor pillars at the first chip end portions.

10. The semiconductor device according to claim 4,
wherein the channel stopper region is in contact with the first semiconductor pillars and the second semiconductor pillars at the first chip end portions.

11. The semiconductor device according to claim 3,
wherein a MOSFET is formed in the device active region.

12. The semiconductor device according to claim 4,
wherein a MOSFET is formed in the device active region.

* * * * *